(12) United States Patent
Kawai et al.

(10) Patent No.: US 11,710,652 B2
(45) Date of Patent: Jul. 25, 2023

(54) TRANSPORT SYSTEM

(71) Applicant: Sinfonia Technology Co., Ltd., Tokyo (JP)

(72) Inventors: Toshihiro Kawai, Tokyo (JP); Hiroaki Nakamura, Tokyo (JP); Gengoro Ogura, Tokyo (JP); Kosuke Sugiura, Tokyo (JP); Yasushi Taniyama, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 17/761,816

(22) PCT Filed: Sep. 23, 2020

(86) PCT No.: PCT/JP2020/035742
§ 371 (c)(1),
(2) Date: Mar. 18, 2022

(87) PCT Pub. No.: WO2021/060259
PCT Pub. Date: Apr. 1, 2021

(65) Prior Publication Data
US 2022/0336245 A1    Oct. 20, 2022

(30) Foreign Application Priority Data

Sep. 26, 2019   (JP) ................................. 2019-176172

(51) Int. Cl.
*H01L 21/677* (2006.01)
*B65G 47/248* (2006.01)
*H01L 21/683* (2006.01)

(52) U.S. Cl.
CPC ...... *H01L 21/67781* (2013.01); *B65G 47/248* (2013.01); *H01L 21/67766* (2013.01); *H01L 21/67796* (2013.01); *H01L 21/6838* (2013.01)

(58) Field of Classification Search
CPC ......... H01L 21/67754; H01L 21/67715; H01L 21/67736; H01L 21/67745;
(Continued)

(56) References Cited

U.S. PATENT DOCUMENTS 5,505,577 A * 4/1996 Nishi ................ H01L 21/67781
414/416.11
5,784,802 A * 7/1998 Thompson ........ H01L 21/67781
34/58
(Continued)

FOREIGN PATENT DOCUMENTS

JP    2006-247762 A    9/2006
JP    2011-142197 A    7/2011
(Continued)

OTHER PUBLICATIONS

International Patent Application No. PCT/JP2020/035742, Search Report (and English translation) and Written Opinion, dated Dec. 22, 2020.

*Primary Examiner* — Gerald McClain
(74) *Attorney, Agent, or Firm* — Kilpatrick Townsend & Stockton LLP

(57) ABSTRACT

A transport system for transporting a plurality of objects between a storage container configured to store the plurality of objects and a processing apparatus configured to collectively process the plurality of objects held on a tray, including a mounting part on which the storage container is mounted, a stage on which the plurality of objects are mounted, a tray support part configured to support the tray, a first transport device configured to transport the plurality of objects between the storage container mounted on the mounting part and the stage, and a second transport device configured to transport the plurality of objects between the stage and the tray supported by the tray support part.

8 Claims, 27 Drawing Sheets

(58) Field of Classification Search
CPC ......... H01L 21/67781; H01L 21/67766; H01L 21/67796; B65G 47/248
See application file for complete search history.

(56) References Cited

U.S. PATENT DOCUMENTS

| | | | | |
|---|---|---|---|---|
| 5,836,736 | A * | 11/1998 | Thompson | H01L 21/67173 414/217 |
| 8,920,103 | B2 * | 12/2014 | Schaller | B25J 9/10 901/17 |
| 9,694,989 | B2 * | 7/2017 | Schaller | H01L 21/67733 |
| 11,322,380 | B1 * | 5/2022 | Lin | H01L 21/67265 |
| 2003/0202871 | A1 * | 10/2003 | Thompson | H01L 21/67781 414/539 |
| 2006/0272987 | A1 * | 12/2006 | Jung | H01L 21/67236 209/538 |
| 2011/0142573 | A1 * | 6/2011 | Blonigan | C23C 16/45565 414/217 |
| 2011/0245957 | A1 * | 10/2011 | Porthouse | H01L 21/67201 134/32 |
| 2011/0313565 | A1 * | 12/2011 | Yoo | H01L 21/6773 700/218 |
| 2013/0068726 | A1 * | 3/2013 | Okita | H01L 21/68742 156/345.24 |
| 2013/0068727 | A1 * | 3/2013 | Okita | H01L 21/67109 156/345.24 |
| 2013/0108401 | A1 * | 5/2013 | Schaller | H01L 21/67736 414/217 |
| 2013/0108406 | A1 * | 5/2013 | Schaller | H01L 21/67213 414/800 |
| 2013/0180953 | A1 | 7/2013 | Iwai | |
| 2014/0023461 | A1 * | 1/2014 | Schaller | H05F 3/02 901/30 |
| 2016/0240415 | A1 * | 8/2016 | Sekiya | H01L 21/67294 |

FOREIGN PATENT DOCUMENTS

| | | |
|---|---|---|
| JP | 2012-222288 A | 11/2012 |
| JP | 2013-258342 A | 12/2013 |
| JP | 2017-069488 A | 4/2017 |
| JP | 6813367 B2 * | 1/2021 ....... H01L 21/67715 |

* cited by examiner

TRANSPORT SYSTEM

CROSS-REFERENCE TO RELATED APPLICATIONS

This application is a national phase application of International Patent Application No. PCT/JP2020/035742, filed on Sep. 23, 2020, which claims priority to Japan Patent Application No. 2019-176172, filed on Sep. 26, 2019, both of which are hereby incorporated by reference in their entireties.

TECHNICAL FIELD

The present disclosure relates to a transport system that transports an object (typically a wafer, or a wafer held in a frame via an adhesive tape, a film, or the like) between a storage container for containing the object and a processing apparatus for processing the object.

BACKGROUND

As is well known, a typical semiconductor manufacturing process includes a wafer process (pre-process) in which a circuit is formed on a wafer and a packaging process (post-process) in which a wafer is cut into chips, formed with external terminals, and sealed with a resin. Further, in recent years, there are cases where a wiring layer or an element is formed between the pre-process and the post-process.

The wafer subjected to the pre-process is very thin and difficult to handle by itself. Therefore, in general, in order to facilitate the handling of such a wafer, as shown in FIG. 27, the wafer subjected to the pre-process is bonded to an adhesive tape 92 (or an adhesive film) attached to a frame 93 having a frame shape (having a substantially annular shape in an example of the figure) slightly larger than the wafer 91 before being sent to the post-process (hereinafter, the wafer 91 held on the frame 93 via the adhesive tape 92 or the like will also be referred to as a "tape frame wafer 90"). By taking such a form, the wafer 91 can be held via the frame 93. This makes it possible to easily handle a thin wafer 91 which is difficult to handle by itself. Further, by adopting such a form, it is possible to prevent chips from being dispersed when the wafer 91 is divided and cut into chips in the post-process.

In a general semiconductor manufacturing factory, a plurality of wafers or a plurality of tape frame wafers (hereinafter referred to as "wafers") are transported or preserved by being stored in a closed storage container (carrier) called a FOUP (Front Opening Unified Pod), a cassette, or the like. In many cases, a processing apparatus for processing a wafer or the like includes a mounting part on which a storage container is mounted, as an interface between the processing apparatus and the storage container, and a transport device for transporting a wafer or the like between the storage container mounted on the mounting part and the processing apparatus. The transport device takes out an unprocessed wafer or the like from the storage container mounted on the mounting part and loads the unprocessed wafer or the like into the body part of the processing apparatus. The transport device unloads a processed wafer or the like from the body part and stores the processed wafer in the storage container mounted on the mounting part.

PRIOR ART DOCUMENTS

Patent Documents

Patent Document 1: Japanese laid-open publication No. 2017-069488
Patent Document 2: Japanese laid-open publication No. 2012-222288

The processing apparatuses used in the semiconductor manufacturing process are roughly divided into an apparatus (so-called single-wafer type) that processes wafers one by one and an apparatus (so-called batch type) that processes a plurality of wafers at once. As an example of the latter, there is known a processing apparatus in which a plurality of wafers is arranged on a tray in planar form and are collectively processed.

In the batch-type processing apparatus using the tray in this way, a transport process is required in which at the interface part, the unprocessed wafers stored in the storage container are arranged on the tray, and the processed wafers held on the tray are stored in the storage container.

In order not to reduce the operating rate of the processing apparatus, it is necessary to sufficiently shorten the cycle time of the transport process at the interface part. For this purpose, the transport operation needs to be performed efficiently.

In order to resolve the above matter, the present invention provides some embodiments of a technique capable of efficiently transporting objects between a storage container that stores the objects and a processing apparatus that collectively processes the objects.

SUMMARY

The present disclosure takes the following measures to achieve the above object.

According to one embodiment of the present disclosure, there is provided a transport system for transporting a plurality of objects between a storage container configured to store the plurality of objects and a processing apparatus configured to collectively process the plurality of objects held on a tray, including:

a mounting part on which the storage container is mounted;
a stage on which the plurality of objects are mounted;
a tray support part configured to support the tray;
a first transport device configured to transport the plurality of objects between the storage container mounted on the mounting part and the stage; and
a second transport device configured to transport the plurality of objects between the stage and the tray supported by the tray support part.

In the above configuration, each object is, for example, a wafer. The wafer as an object may be, for example, a wafer itself or may be held by a frame via an adhesive tape, a film, or the like.

According to this configuration, two transport devices (the first transport device and the second transport device) transport the objects between the storage container and the tray while cooperating with each other via the stage. Therefore, for example, while one transport device is performing an operation of transporting unprocessed objects toward the tray (feed transport operation), the other transport device can perform an operation of transporting processed objects toward the storage container (return transport operation). That is, it is possible to simultaneously perform the feed transport operation and the return transport operation, and it is possible to efficiently transport the objects between the storage container for storing the objects and the processing apparatus for collectively processing the objects.

Preferably, in the transport system, the second transport device is configured to transport n objects (where n is an integer of 2 or more) at a time, and the tray is configured to hold n×m objects (where m is an integer of 1 or more).

According to this configuration, the second transport device transports a plurality of objects at a time. Therefore, the second transport device can efficiently transport the objects between the stage and the tray. In particular, the integral multiple of the number of objects that can be transported by the second transport device at one time is the total number of objects held on the tray. Therefore, it is possible to especially enhance the transport efficiency of the second transport device.

Preferably, in the transport system, the stage includes a movable stage portion provided to be movable between a delivery position accessible by the second transport device and a retracted position deviated from the delivery position, and a fixed stage portion fixedly provided at the delivery position and at a height position vertically shifted from the movable stage portion.

According to this configuration, it is possible to sufficiently secure the number of objects that can be mounted on the stage. Therefore, it is possible to enhance the transport efficiency of both the first transport device and the second transport device.

Preferably, the transport system further includes:

an inverting device configured to invert the plurality of objects, wherein the first transport device is configured to transport the plurality of objects among the storage container mounted on the mounting part, the stage, and the inverting device.

According to this configuration, the objects stored in the storage container can be inverted and then mounted on the tray. When the objects are inverted and then mounted on the tray in the transport process, it is difficult to shorten the cycle time in the transport process, which may become a bottleneck and may reduce the operating rate of the processing apparatus. However, in this configuration, the objects are transported between the storage container and the tray while the two transport devices (the first transport device and the second transport device) cooperate with each other via the stage. This makes it possible to efficiently transport the objects. Therefore, even when the objects are inverted, it is possible to sufficiently shorten the cycle time in the transport process.

Preferably, the transport system further includes:

a stocker configured to temporarily store the plurality of objects, wherein the first transport device is configured to transport the plurality of objects among the storage container mounted on the mounting part, the stage, and the stocker.

According to this configuration, the first transport device temporarily stores the objects stored in the storage container or the objects mounted on the stage in the stocker depending on the situation. This makes it possible to efficiently transport the objects.

Preferably, the transport system further includes:

a tray transport device configured to receive the tray holding processed objects from the processing apparatus and deliver the tray holding unprocessed objects to the processing apparatus.

According to this configuration, the processing apparatus does not need to have a mechanism for delivering the tray to the transport system. Therefore, the transport system can be applied to a wide range of processing apparatuses.

According to the present disclosure, it is possible to efficiently transport the objects between the storage container that stores the objects and the processing apparatus that collectively processes the objects.

DETAILED DESCRIPTION

Embodiments of the present disclosure will now be described in detail with reference to the accompanying drawings.

1. Overall Configuration

Figure 1:
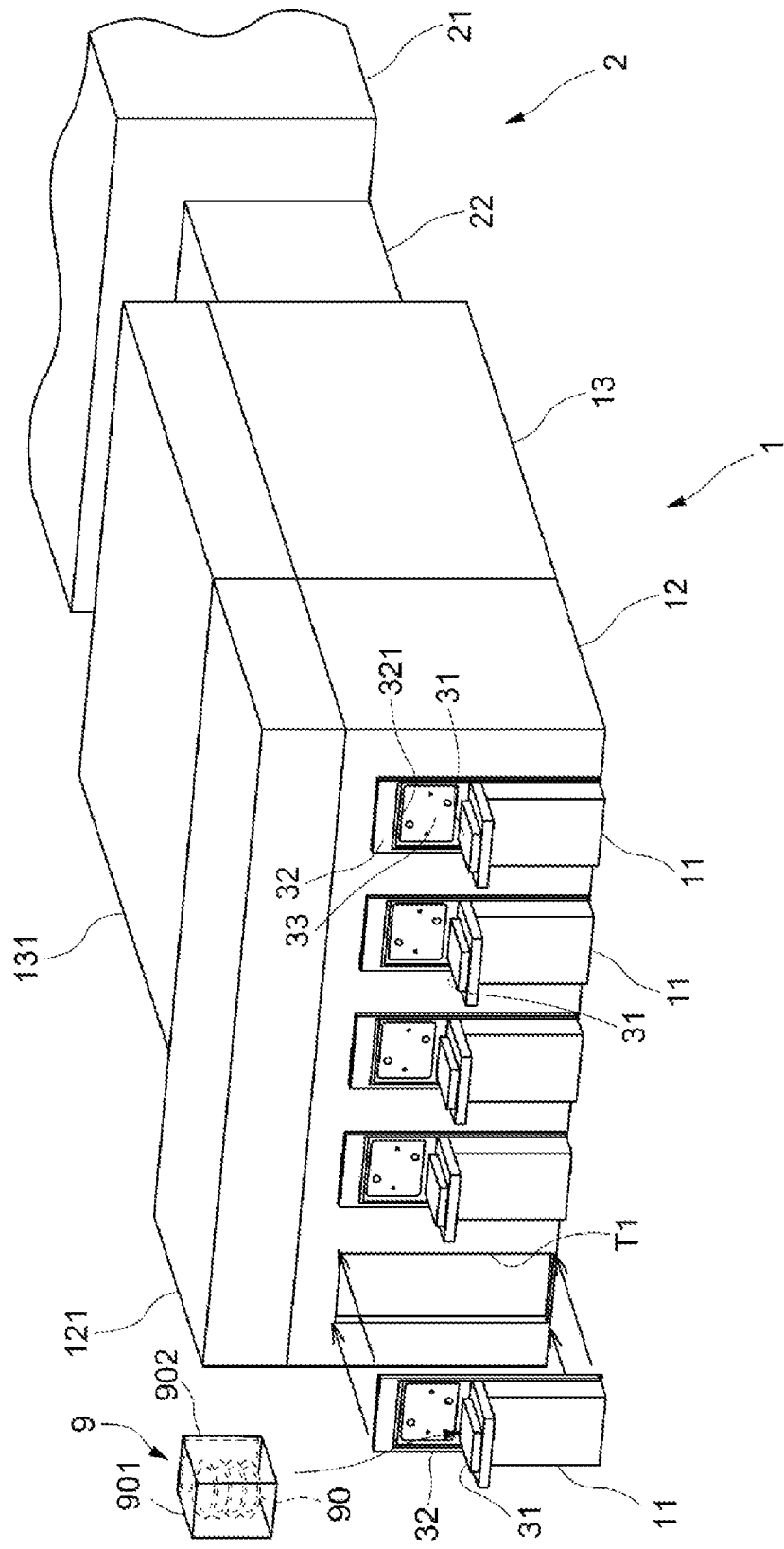
FIG. 1 is a perspective view schematically showing a configuration of a transport system according to an embodiment.
Figure 2:
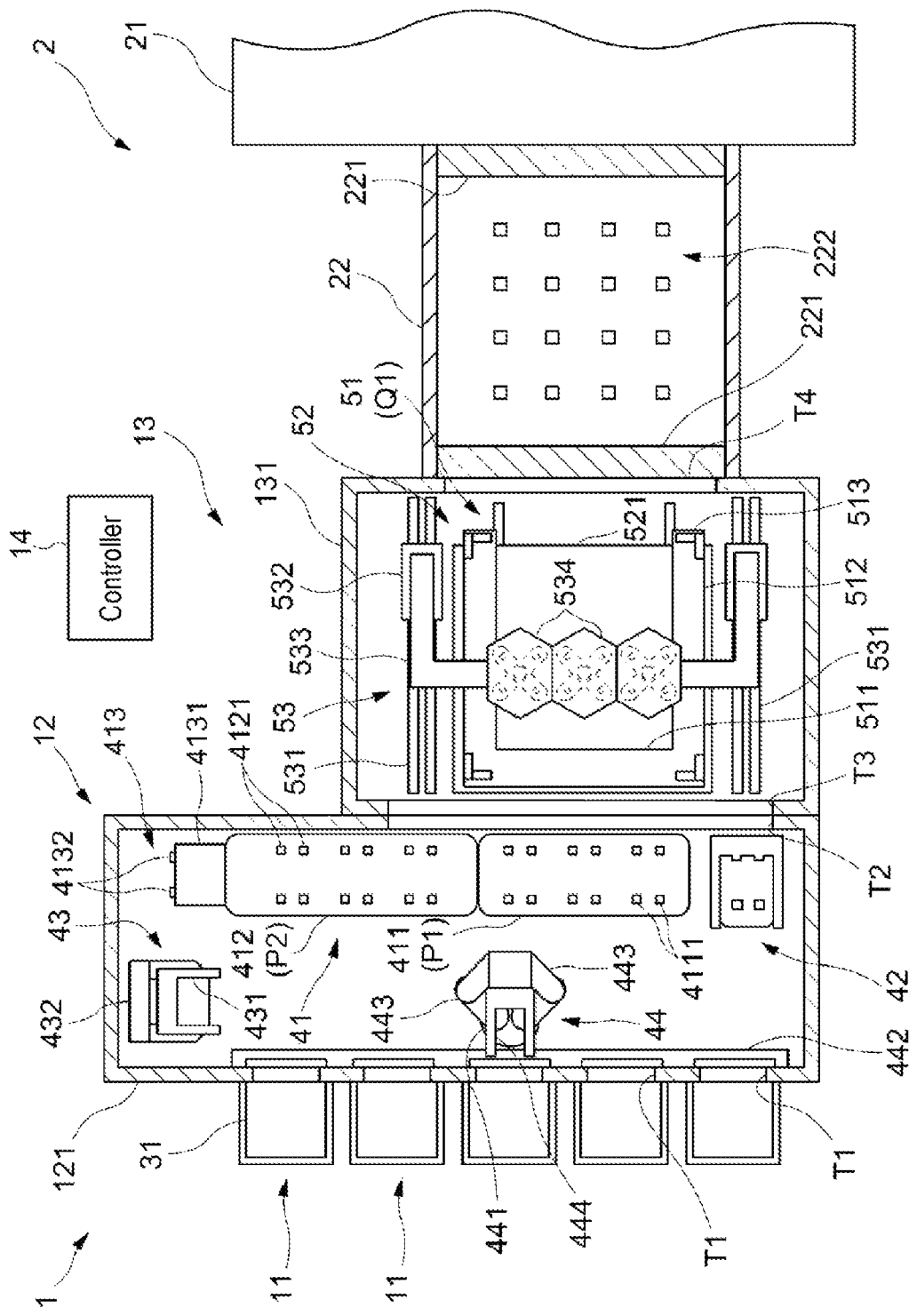
FIG. 2 is a plan view schematically showing the configuration of the transport system.

The overall configuration of the transport system according to an embodiment will be described mainly with reference to FIGS. 1 and 2. FIG. 1 is a perspective view schematically showing a configuration of a transport system 1 according to an embodiment. FIG. 2 is a plan view schematically showing the configuration of the transport system 1.

Figure 27:
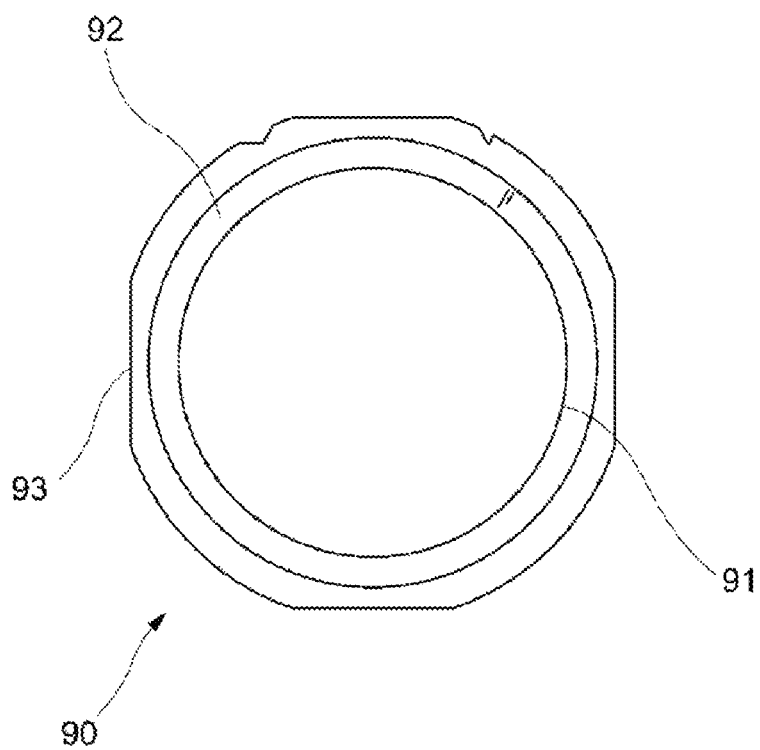
FIG. 27 is a diagram for explaining a tape frame wafer.

The transport system 1 is used by being connected to a processing apparatus 2 and is configured to transport an object 90 between a storage container 9 for storing a plurality of objects 90 and a processing apparatus 2 for collectively processing a plurality of objects 90. In the present embodiment, the object 90 is a wafer 91 held by a frame 93 via an adhesive tape 92, i.e., a tape frame wafer 90 (see FIG. 27). Further, the storage container 9 is a closed container used for transporting and storing the tape frame wafer 90. The storage container 9 includes a body portion 901 for storing a plurality of tape frame wafers 90 in multiple stages in a horizontal posture and a lid 902 for closing an opening provided on one side wall of the body portion 901.

Prior to specifically describing the transport system 1, the processing apparatus 2 to which the transport system 1 is connected will be described.

Figure 3:
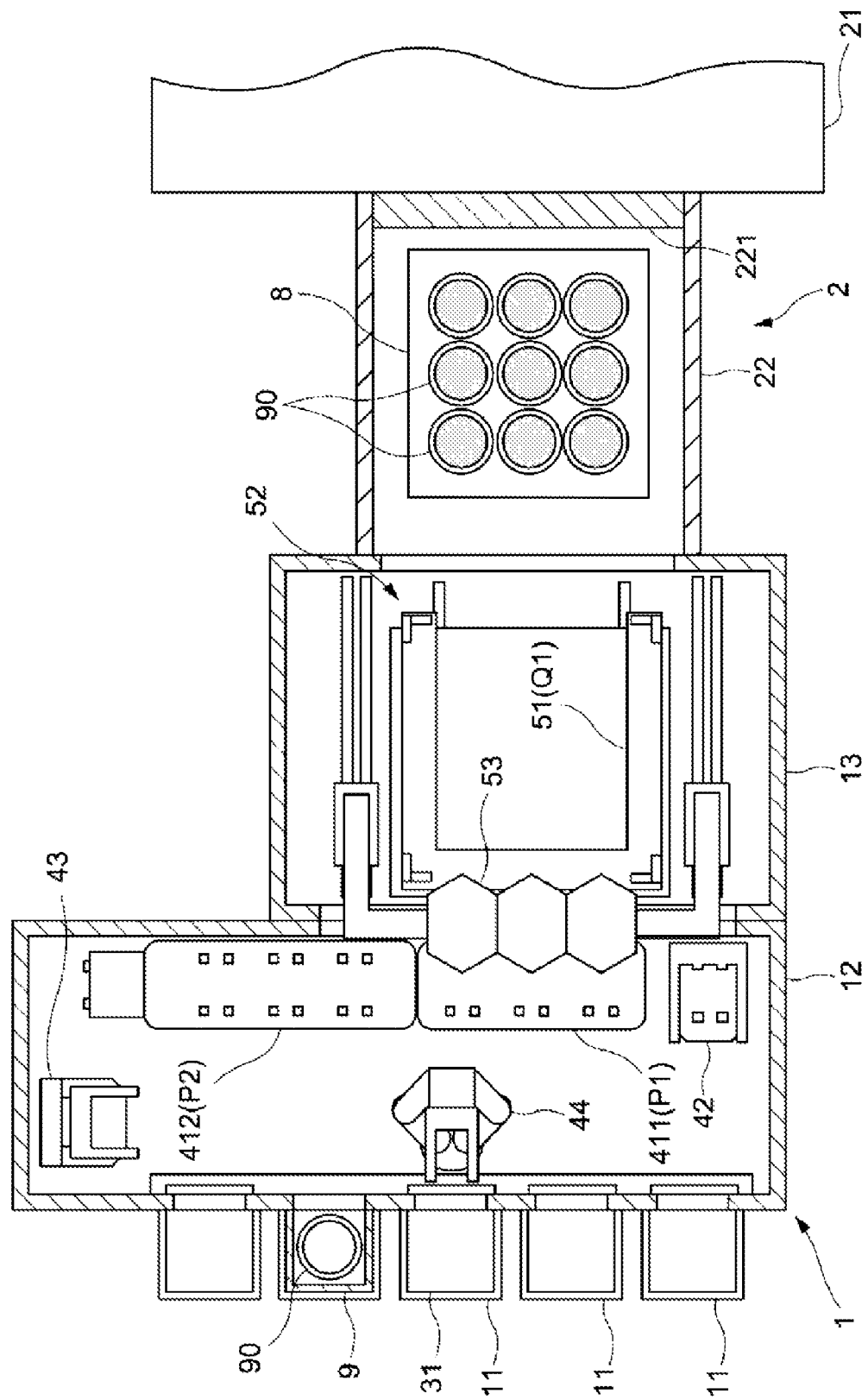
FIG. 3 is a diagram for explaining a first aspect in a series of operations performed in the transport system.

The processing apparatus 2 includes a processing part 21 that collectively performs predetermined processing on a plurality of tape frame wafers 90 arranged on a tray 8 in a planar form (see FIG. 3). The tray 8 used here has a substantially square shape in a plan view and can support nine tape frame wafers 90 side by side in 3 columns×3 rows. Although not shown, the bottom surface of the tray 8 (the mounting surface for the tape frame wafers 90) has openings arranged in 3 columns×3 rows. At least a portion of the wafer 91 of each of the tape frame wafers 90 overlaps with each of the openings. The tape frame wafers 90 are mounted on the tray 8 so that the surface (circuit formation surface) of the wafer 91 faces downward and leads to each of the openings. In the processing part 21, a predetermined process is performed on the surface of the wafer 91 from the lower side of the tray 8 via each of the openings.

A load lock part 22 which is a vacuum spare chamber is connected to the processing part 21, and the transport system 1 is connected to the processing part 21 via the load lock part 22. A door 221 is provided at the portion of the load lock part 22 connected to the transport system 1 (or the processing part 21). By closing the door 221, the internal space of the load lock part 22 is airtightly sealed. Further, the load lock part 22 is provided with a tray support pin group 222 for supporting the tray 8 in a horizontal posture. In the following, for the sake of convenience of explanation, the side on which the transport system 1 is connected to the load lock part 22 is referred to as "front side." Further, the horizontal direction orthogonal to the front-back direction is referred to as "left-right direction."

Next, the transport system 1 will be specifically described.

The transport system 1 includes a plurality of load ports 11, a first transport part 12, a second transport part 13, and a controller 14 that controls these parts 11, 12 and 13.

The load ports 11 are connected to the front side of the first transport part 12. That is, one or more (five, in the example of the figure) openings T1 are formed in the front wall portion of the housing (first housing) 121 of the first transport part 12, and the load ports 11 are airtightly attached to close the respective openings T1.

The first transport part 12 is provided adjacent to the front side of the second transport part 13. An opening T2 is formed in the rear wall portion of the first housing 121. An opening T3 is formed at a position corresponding to the opening T2 in the front wall portion of the housing (second housing) 131 of the second transport part 13. That is, the internal spaces of both housings 121 and 131 communicate with each other through the openings T2 and T3. Further, an opening T4 is formed in the rear wall portion of the second housing 131. The opening T4 is airtightly closed by the door 221 of the load lock part 22.

Hereinafter, the configurations of the respective parts 11 to 14 included in the transport system 1 will be described more specifically with reference to FIGS. 1 and 2.

(Load Port 11)

The load port 11 is a device for bringing the internal space of the storage container 9 into communication with the internal space of the first housing 121 without exposing the tape frame wafers 90 stored in the storage container 9 to the outside atmosphere. The load port 11 is provided with a mounting part on 31 on which the storage container 9 is mounted. If necessary, the mounting part 31 may be provided with a guide pin that guides the storage container 9 to a predetermined position, a fixing pin that fixes the storage container 9 to the predetermined position, a gas supply nozzle that supplies a predetermined gas to the internal space of the storage container 9, a gas discharge nozzle that discharges the gas in the internal space of the storage container 9, a driving mechanism that slides the mounting part 31 back and forth, and the like (all of which are not shown).

As shown in FIG. 1, the mounting part 31 is provided on the front surface of a panel plate 32 which is a flat plate-shaped member. The panel plate 32 is slightly larger than the opening T1 formed in the first housing 121. By attaching the panel plate 32 to airtightly close the opening T1, the load port 11 is connected to the first housing 121.

The panel plate 32 is formed with an opening 321 for passing the tape frame wafer 90 therethrough. A door portion 33 capable of airtightly closing the opening 321 and a door portion driving mechanism (not shown) for moving the door portion 33 between a closed position and an open position are provided on the rear side of the panel plate 32. Further, the door portion 33 is provided with a lid holding mechanism that removes the lid 902 of the storage container 9 mounted on the mounting part 31 from the body portion 901 (releases the latch) and integrally connects (docks) the lid 902 to the door portion 33.

The operation of the load port 11 is as follows. When the storage container 9 containing the unprocessed tape frame wafers 90 is placed on the mounting part 31 by an external robot such as an AMHS, a PGV, etc., the mounting part 31 is slid backward so that the lid 902 of the storage container 9 mounted thereon and the door portion 33 are sufficiently close to each other. Then, the lid holding mechanism provided on the door portion 33 removes the lid 902 of the storage container 9 from the body portion 901 and integrally connects the lid 902 to the door portion 33. Subsequently, the door portion driving mechanism moves the door portion 33 together with the lid 902 integrated with the door portion 33 from the closed position where the opening 321 is airtightly closed to the open position where the opening 321 is completely opened. As a result, the internal space of the body portion 901 is in communication with the internal space of the first housing 121 through the opening 321. It goes without saying that by performing the reverse operation, the body portion 901 of the storage container 9 is closed by the lid 902, and the opening 321 is closed by the door portion 33, i.e., the storage container 9 and the first housing 121 are separated from each other.

(First Transport Part 12)

The first transport part 12 is configured to include, inside the first housing 121, a stage 41 on which a plurality of tape frame wafers 90 are placed, a stocker 42 for temporarily storing the tape frame wafers 90, an inverting device 43 for inverting the tape frame wafers 90, a transport device (first transport device) 44 for transporting the tape frame wafers 90 among these parts 41, 42 and 43, and the like. Further, a fan filter unit (FFU) (not shown) is provided inside the first housing 121 so that a clean gas downflow is formed in the internal space of the first housing 121.

The stage 41 includes a stage portion installed fixedly (fixed stage portion) 411, a stage portion installed movably (movable stage portion) 412, and a stage driving mechanism 413 for moving the movable stage portion 412.

The fixed stage portion 411 is a long flat plate-shaped member and is configured so that three tape frame wafers 90 can be placed on the upper surface thereof side by side in a row along the longitudinal direction. Support pins 4111 for supporting each tape frame wafer 90 placed on the upper surface of the fixed stage portion 411 are provided on the upper surface. The fixed stage portion 411 is fixedly arranged at a position P1 facing the opening T2 in the vicinity of the rear wall portion of the first housing 121 so that the longitudinal direction thereof extends along the left-right direction. The position P1 facing the opening T2 is a position accessible by the second transport device 53 described later and is also hereinafter referred to as a "delivery position P1".

Like the fixed stage portion 411, the movable stage portion 412 is a long flat plate-shaped member and is configured so that three tape frame wafers 90 can be placed on the upper surface thereof side by side in a row along the longitudinal direction. Support pins 4121 for supporting each tape frame wafer 90 placed on the upper surface of the movable stage portion 412 are provided on the upper surface. The movable stage portion 412 is arranged in the vicinity of the rear wall portion of the first housing 121 so that the longitudinal direction thereof extends along the left-right direction. In FIG. 2, the movable stage portion 412 is arranged at a position deviated from the opening T2 (i.e., a position deviated from and not overlapped with the delivery position P1 when viewed from above) (hereinafter also referred to as a "retracted position") P2. The movable stage portion 412 is configured so that, by being moved in the left-right direction (i.e., the extension direction) under the driving of a below-described stage driving mechanism 413, the movable stage portion 412 can be moved between the retracted position P2 and the position facing the opening T2 (i.e., the delivery position P1) (see FIG. 9). However, the movable stage portion 412 is arranged at a height position vertically shifted from the fixed stage portion 411. Specifically, the movable stage portion 412 is arranged at a position shifted to the upper side of the fixed stage portion 411. Therefore, the stage portions 411 and 412 can be arranged at the delivery position P1 together without interfering with each other.

The stage driving mechanism 413 is a mechanism for moving the movable stage portion 412 and includes a stage support portion 4131 for supporting the stage, a pair of rails 4132 and 4132 laid on the bottom surface of the first housing 121 and extending in the left-right direction, and a linear motion mechanism (not shown) for allowing the stage support portion 4131 to travel along the pair of rails 4132 and 4132. The linear motion mechanism may be configured to include, for example, a ball screw mechanism and a motor that gives a driving force to the ball screw mechanism (the same applies hereinafter). The movable stage portion 412 is supported by the stage support portion 4131 at one end thereof in a cantilevered manner and is moved between the delivery position P1 and the retracted position P2 as the stage support portion 4131 moves along the pair of rails 4132 and 4132.

The stocker 42 is a storage part (so-called buffer part) for temporarily storing a plurality of tape frame wafers 90 and is arranged in the vicinity of the delivery position P1. Specifically, for example, the stocker 42 is a box-shaped container with an open front side and is configured to store 12 or 13 tape frame wafers 90 in multiple stages in a horizontal posture.

The inverting device 43 is a device for inverting the tape frame wafer 90 and is arranged on the opposite side of the stocker 42 with the stage 41 interposed therebetween. The term "inverting" as used herein means that the posture in which the surface (circuit forming surface) of the wafer 91 of the tape frame wafer 90 faces upward and the posture in which the surface of the wafer 91 faces downward are changed one another. Specifically, the inverting device 43 is configured to include, for example, a sandwiching member 431 that holds the frame 93 of the tape frame wafer 90 by sandwiching it in the horizontal direction, and a driving part 432 that rotates the sandwiching member 431 around a horizontal axis. In such a configuration, the tape frame wafer 90 is inverted as the driving part 432 rotates the sandwiching member 431 by 180 degrees around the horizontal axis while the sandwiching member 431 holds the tape frame wafer 90 in a horizontal posture.

The first transport device 44 is a device for transporting the tape frame wafer 90 and includes a body portion 441, a rail 442 provided on the front wall portion of the first housing 121 and extending in the left-right direction, and a linear motion mechanism (not shown) for allowing the body portion 441 to travel along the rail 442. As the body portion 441 is moved along the rail 442, the body portion 441 is moved in the left-right direction.

Two arms 443 and 443 are provided on the body portion 441. Each arm 443 is provided at the base end portion to be rotatable around an axis perpendicular to the body portion 441 and is configured to swivel by being rotated around the base end portion. In addition, each arm 443 is formed by connecting a plurality of link elements so as to swivel horizontally and is configured to be expandable and contractible.

A hand 444 is provided at the tip of each arm 443. The hand 444 is provided at the base end to be rotatable around an axis perpendicular to the arm 443. In the present embodiment, the hand 444 is configured to hold the tape frame wafer 90 in a substantially horizontal posture by holding the frame 93 of the tape frame wafer 90 by a mechanical chucking method. However, the chucking method of the hand 444 is not limited thereto and may be a vacuum suction method or the like.

By adopting such a configuration, the first transport device 44 can transport the tape frame wafer 90 among the storage container 9 mounted on the mounting part 31 of the load port 11, the stage 41 (specifically, the fixed stage portion 411 and the movable stage portion 412), the stocker 42, and the inverting device 43.

(Second Transport Part 13)

The second transport part 13 is configured to include a tray support part 51 for supporting the tray 8, a tray support part driving mechanism 52 for moving the tray support part 51 inside the second housing 131, a transport device (second transport device) 53 for transporting the tape frame wafer 90 between the stage 41 of the first transport part 12 and the tray 8 supported by the tray support part 51, and the like. Further, a fan filter unit or the like (not shown) is provided inside the second housing 131 so that a clean gas downflow is formed in the internal space of the second housing 131.

The tray support part 51 is a member that supports the tray 8 in a horizontal posture. Specifically, the tray support part 51 is a member formed by combining three long flat plate members in a U-shape and includes a vertical flat plate member 511 arranged to extend in the left-right direction, and a pair of horizontal flat plate members 512 and 512 connected to both ends of the vertical flat plate member 511 and arranged to extend in the front-rear direction. By arranging the upper surfaces of these three flat plate members 511, 512 and 512 to be substantially flush with each other, a support surface for supporting the tray 8 is formed. A positioning member 513 for positioning the four corners of the tray 8 supported thereon is provided on the support surface.

The tray support part 51 is configured so that, by being moved in the front-rear direction under the driving of a tray support part driving mechanism 52 described later, it can move between a position Q1 facing the opening T3 and a position Q2 in the load lock part 22 (see FIG. 5). In this regard, the position Q1 facing the opening T3 is a position to which a second transport device 53 described later is accessible. The position Q1 is also hereinafter referred to as a "delivery position Q1". On the other hand, the position Q2 in the load lock part 22 is a position where the tray support pin group 222 provided in the load lock part 22 is arranged between the pair of horizontal flat plate members 512 and 512. Hereinafter, the position Q2 is also called "pin group position Q2".

The tray support part driving mechanism 52 is a mechanism for moving the tray support part 51 and includes a movable base portion 521 that supports the tray support part 51. A pair of rails 522 and 522 extending in the left-right direction are laid on the upper surface of the movable base portion 521 (see FIG. 5). The tray support part 51 is slidable along the pair of rails 522 and 522. In addition, a linear motion mechanism (not shown) for moving the tray support part 51 along the pair of rails 522 and 522 is provided between the pair of rails 522 and 522 and the tray support part 51.

Figure 5:
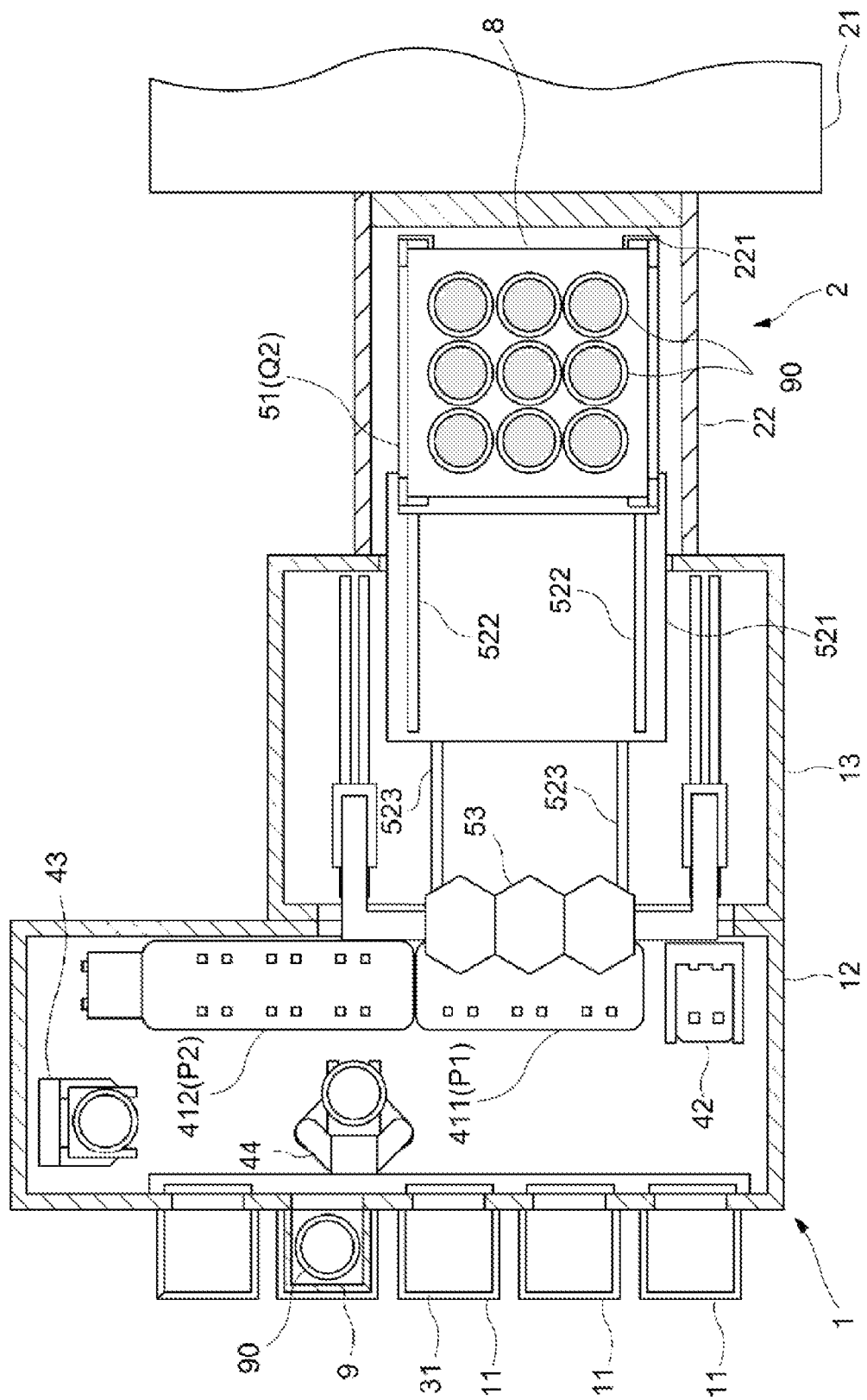
FIG. 5 is a diagram for explaining the second aspect in the series of operations performed in the transport system.

Further, a pair of rails 523 and 523 extending in the left-right direction are laid on the floor surface of the second housing 131 (see FIG. 5). The movable base portion 521 is slidable along the pair of rails 523 and 523. In addition, a linear motion mechanism (not shown) for moving the movable base portion 521 along the pair of rails 523 and 523 is provided between the pair of rails 523 and 523 and the movable base portion 521.

In such a configuration, the movable base portion 521 is arranged in the second housing 131, and the tray support part 51 is arranged at a position where the tray support part 51 overlaps with the movable base portion 521, whereby the tray support part 51 is arranged at the delivery position Q1. From this state, the tray support part 51 is moved rearward along the pair of rails 522 and 522 (see FIG. 4), and the movable base portion 521 is moved rearward along the pair of rails 523 and 523, whereby the tray support part 51 is arranged at the pin group position Q2 (see FIG. 5).

The tray 8 is transported between the transport system 1 and the processing apparatus 2 as the tray support part 51 that supports the tray 8 is moved between the delivery position Q1 and the pin group position Q2. That is, the tray support part 51 and the tray support part driving mechanism 52 constitute a tray transport device that transports the tray 8 between the transport system 1 and the processing apparatus 2.

The second transport device 53 is a device for transporting the tape frame wafer 90 and includes a pair of rail groups 531 and 531 laid on the floor surface of the second housing 131 and extending in the left-right direction, a movable block 532 provided in each rail group 531, and a linear motion mechanism (not shown) for allowing the movable block 532 to travel along the rail groups 531. Each movable block 532 is provided with a pair of extendible elevating columns (not shown), and a frame portion 533 having a gate shape in a plan view is provided so as to be bridged between the upper ends of the pair of elevating columns. In addition, three suction portions 534, 534 and 534 arranged on the left and right are supported on the left and right extending portions of the frame portion 533.

Each suction portion 534 is configured to hold the tape frame wafer 90 in a substantially horizontal posture by holding the frame 93 portion of the tape frame wafer 90 by a vacuum suction method.

The second transport device 53 can transport three tape frame wafers 90 at a time between the stage 41 and the tray 8 supported by the tray support part 51. For example, when the tape frame wafer 90 held in the tray 8 supported by the tray support part 51 is transported onto the stage 41, the second transport device 53 performs the following operation.

Figure 8:
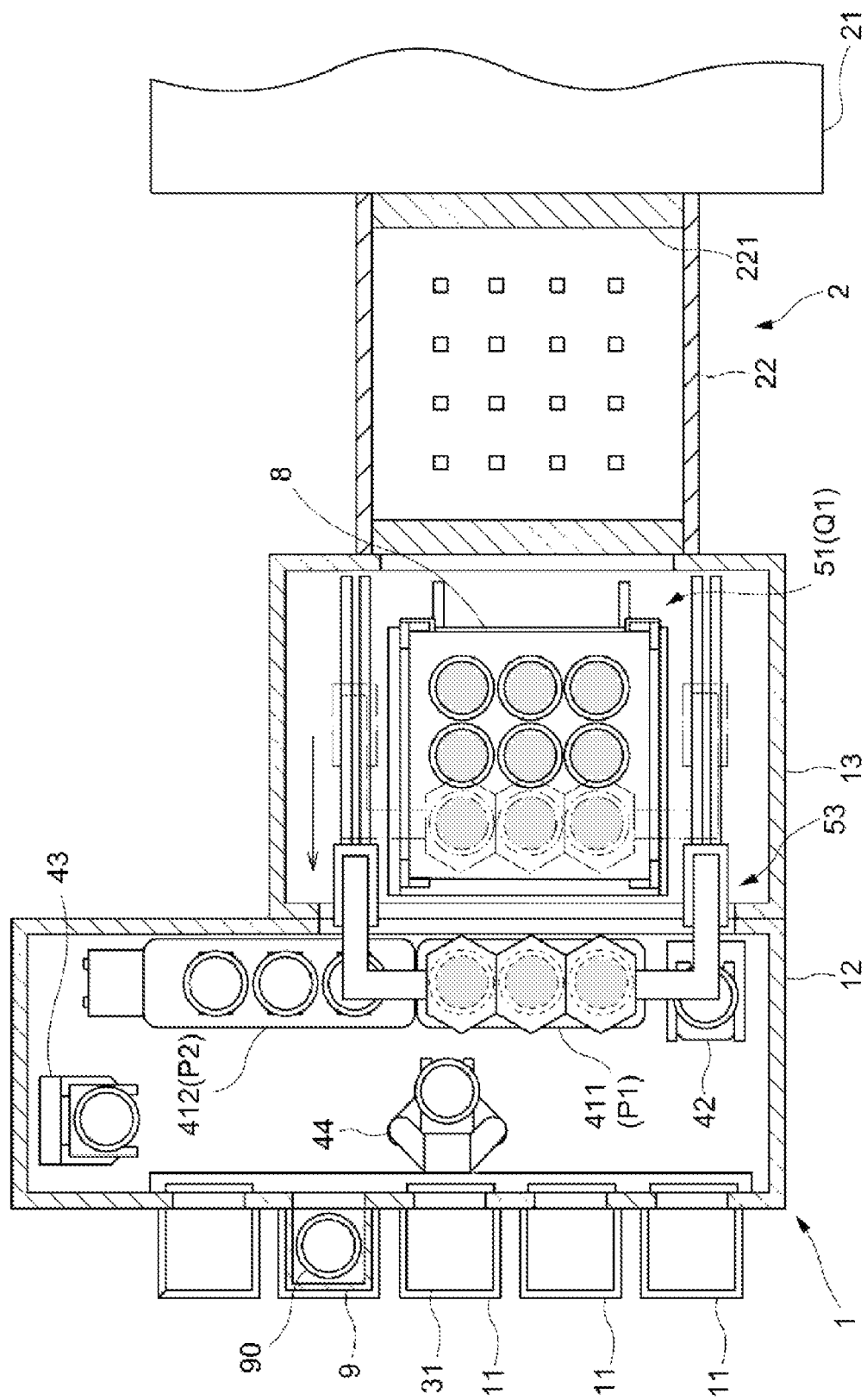
FIG. 8 is a diagram for explaining a third aspect in the series of operations performed in the transport system.

First, each movable block 532 is moved along the rail group 531 so that the three suction portions 534, 534 and 534 provided on the frame portion 533 can be moved to a position (tray access position) where, when viewed from above, the three suction portions 534, 534 and 534 overlap with the tape frame wafers 90 on the tray 8 supported by the tray support part 51 arranged at the delivery position Q1 (see the virtual line in FIG. 8). Then, the elevating column is contracted so that each suction portion 534 can be moved down to a position sufficiently close to each tape frame wafer 90. In this state, the suction force of each suction portion 534 is exerted. Then, the frame 93 is sucked by the suction portion 534, and the tape frame wafer 90 is held by the suction portion 534. In the present embodiment, it is assumed that the suction states of the three suction portions 534, 534 and 534 are switched synchronously, whereby the three tape frame wafers 90 held in the tray 8 are held at the same time.

Subsequently, the elevating column is expanded so that each suction portion 534 can be moved up together with the tape frame wafer 90. Thereafter, each movable block 532 is moved along the rail group 531 so that each suction portion 534 can be arranged at a position (stage access position) where, when viewed from above, each suction portion 534 overlaps with the fixed stage portion 411 arranged at the delivery position P1 (or the movable stage portion 412 arranged at the delivery position P1) (see the solid line in FIG. 8). Then, the elevating column is contracted so that the tape frame wafer 90 held by each suction portion 534 can be moved down to a position sufficiently close to the fixed stage portion 411. Thereafter, the suction force of each suction portion 534 is stopped. Also in this case, the suction states of the three suction portions 534, 534 and 534 are switched synchronously, whereby the three tape frame wafers 90 are simultaneously released and delivered onto the support pins 4111 provided in the fixed stage portion 411.

By performing the above operation, the three tape frame wafers 90 held in the tray 8 are collectively transported to the stage 41. Further, by performing the reverse operation to the above, the three tape frame wafers 90 placed on the stage 41 are collectively transported to the tray 8.

(Controller 14)

The controller 14 controls the operation of each part included in the transport system 1. The configuration of the controller 14 as hardware is the same as that of a general computer. That is, the controller 14 includes a CPU that performs various arithmetic processes, a ROM which is a read-only memory that stores basic programs, a RAM which is a readable/writable memory that stores various kinds of information, a magnetic disk that stores control software, data or the like, and so forth. As the CPU of the controller 14 executes a predetermined processing program, a predetermined transport operation proceeds in the transport system 1.

2. Operation of Transport System 1

The transport system 1 performs a predetermined transport operation to arrange the unprocessed tape frame wafers 90 stored in the storage container 9 on the tray 8 side by side and store the processed tape frame wafers 90 held on the tray 8 in the storage container 9. Hereinafter, an example of the transport operation executed in the transport system 1 will be described with reference to FIGS. 3 to 26. The series of operations described below is executed under the control of the controller 14.

In the following, the series of operations performed by the transport system 1 will be described by dividing it into six aspects. However, this is for convenience only to make the explanation easy to understand. That is, in the actual operation, it is not necessary for each aspect to be performed separately in time. For example, it may well be permitted that the last part of one aspect and the first part of the next aspect are performed in parallel.

First Aspect

First, the storage container 9 containing a plurality of unprocessed tape frame wafers 90 is mounted on the mounting part 31 of the load port 11. Then, the load port 11 performs a predetermined operation so that the internal space of the body portion 901 of the storage container 9 is brought into communication with the internal space of the first housing 121 through the opening 321 (FIG. 3).

On the other hand, in the processing apparatus 2, the tray 8 holding nine processed tape frame wafers 90 is moved from the processing part 21 to the load lock part 22 and is supported by the tray support pin group 222 provided in the load lock part 22. Then, the door 221 that closes the opening T4 is opened to bring the internal space of the load lock part 22 and the internal space of the second housing 131 into communication with each other (FIG. 3).

Second Aspect

Figure 4:
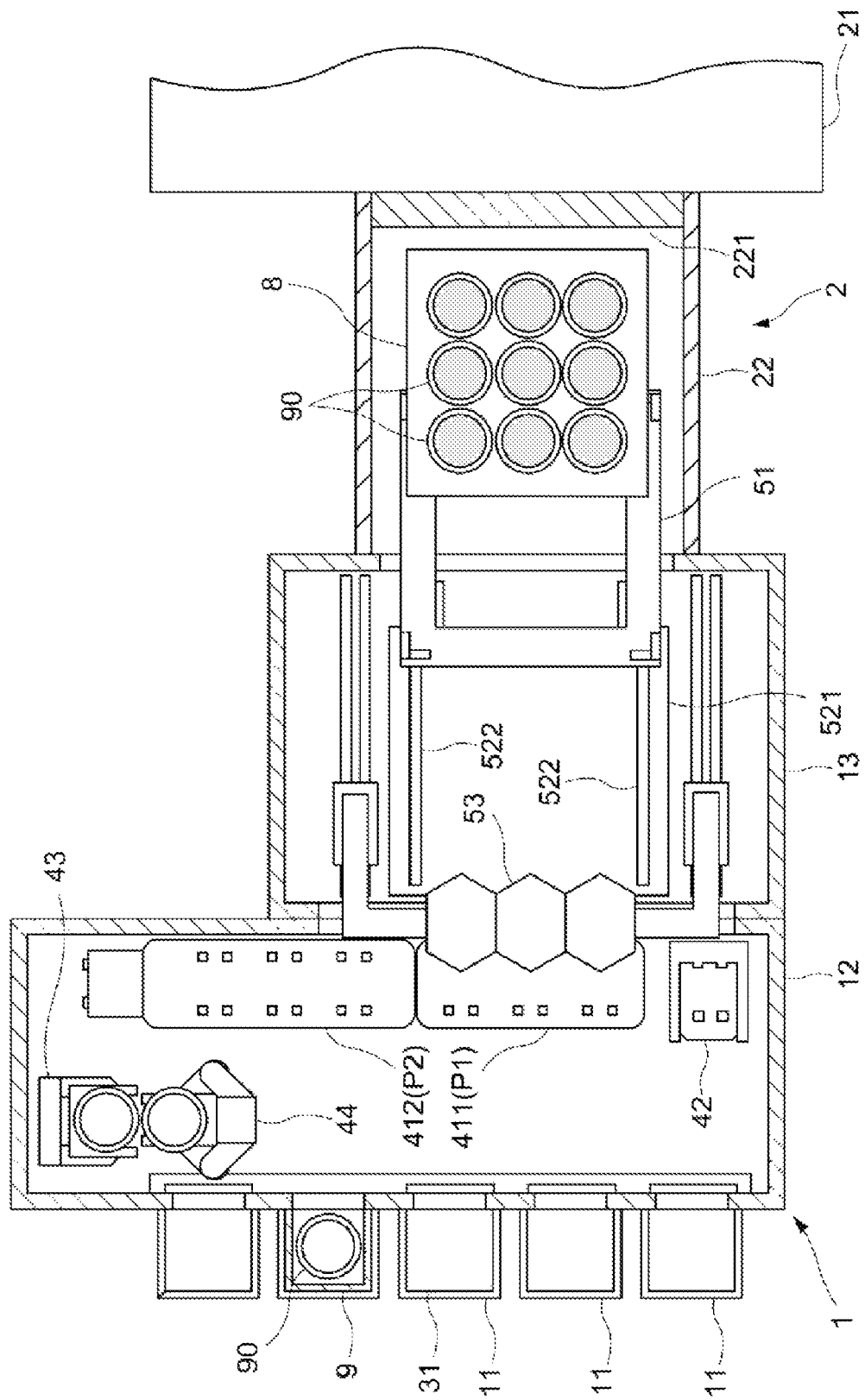
FIG. 4 is a diagram for explaining a second aspect in the series of operations performed in the transport system.
Figure 6:
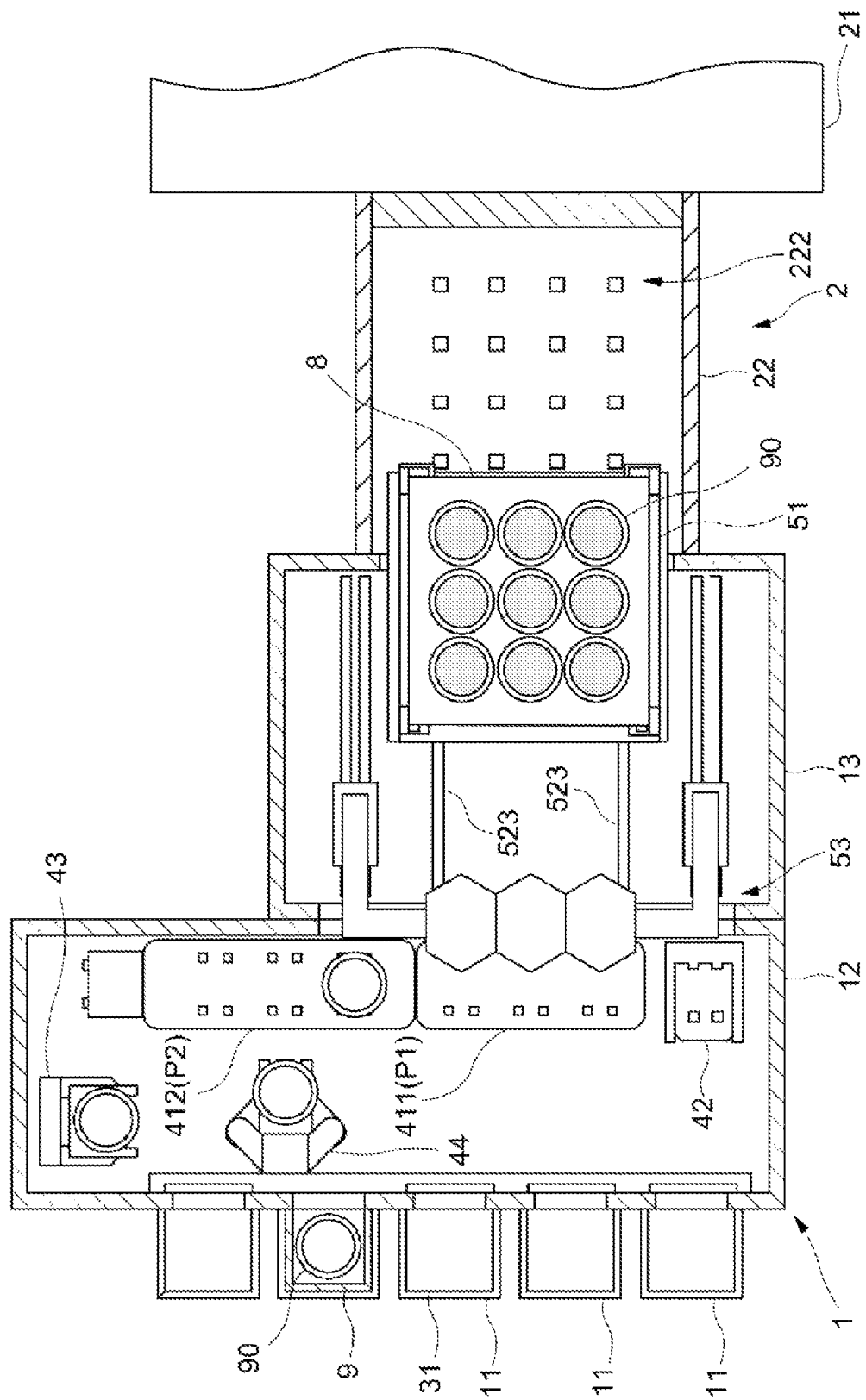
FIG. 6 is a diagram for explaining the second aspect in the series of operations performed in the transport system.

When the internal space of the storage container 9 mounted on the mounting part 31 is in communication with the internal space of the first housing 121, the first transport device 44 takes out the unprocessed tape frame wafer 90 stored in the storage container 9 and delivers the unprocessed tape frame wafer 90 to the inverting device 43 (FIG. 4). After the inverting device 43 inverts the tape frame wafer 90, the first transport device 44 receives the inverted tape frame wafer 90 and transports it to the movable stage portion 412 arranged at the retracted position P2 (FIGS. 5 and 6). Such an operation is repeated to mount three unprocessed tape frame wafers 90 on the movable stage portion 412 (FIG. 7).

In parallel with the above operation, the tray support part driving mechanism 52 moves the tray support part 51 from the delivery position Q1 to the pin group position Q2 (FIGS. 4 and 5). The tray support pin group 222 provided in the load lock part 22 is capable of protruding and retracting. As the tray support pin group 222 comes into a retracted state while the tray support part 51 is arranged at the pin group position Q2, the tray 8 is transported from the tray support pin group 222 onto the tray support part 51. Thereafter, the tray support part driving mechanism 52 moves the tray support part 51 from the pin group position Q2 to the delivery position Q1 (FIGS. 6 and 7). As a result, the tray 8 is carried out from the load lock part 22 and carried into the second housing 131. After the tray 8 is carried out, the door 221 of the load lock part 22 is closed.

Figure 7:
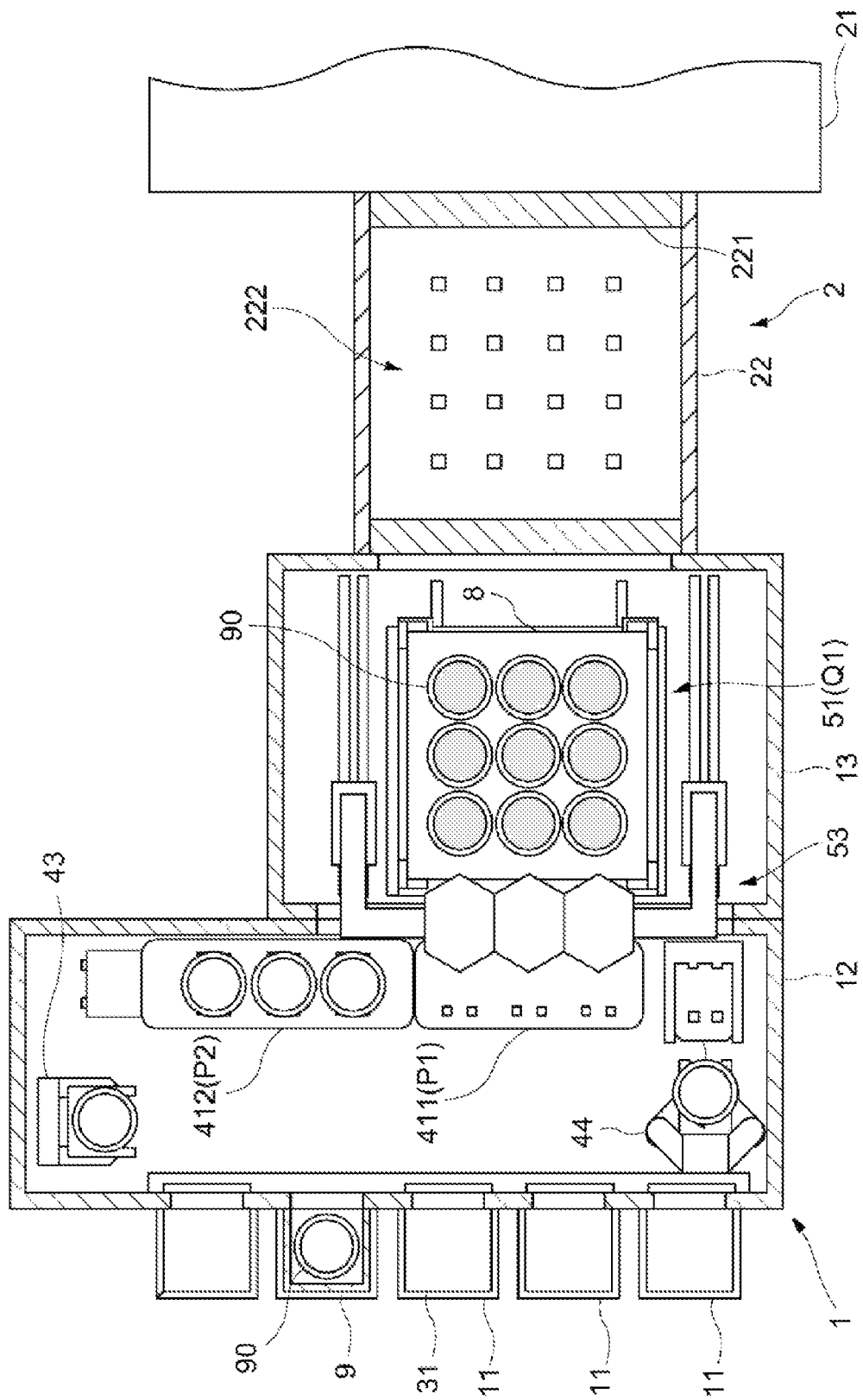
FIG. 7 is a diagram for explaining the second aspect in the series of operations performed in the transport system.

In this way, the state shown in FIG. 7 is obtained. That is, the movable stage portion 412 is filled with the three unprocessed tape frame wafers 90, and the tray 8 is arranged in the second housing 131.

Third Aspect

The first transport device 44 subsequently takes out the fourth tape frame wafer 90 stored in the storage container 9, delivers the fourth tape frame wafer 90 to the inverting device 43, and receives the inverted fourth tape frame wafer 90 from the inverting device 43. Since the movable stage portion 412 is already filled with three tape frame wafers 90, the fourth tape frame wafer 90 cannot be mounted on the movable stage portion 412. Therefore, the first transport device 44 inverts the fourth and subsequent tape frame wafers 90 and stores them in the stocker 42 (FIG. 8). The first transport device 44 repeats such an operation until the stocker 42 stores six unprocessed tape frame wafers 90 (FIGS. 8 to 11).

Figure 9:
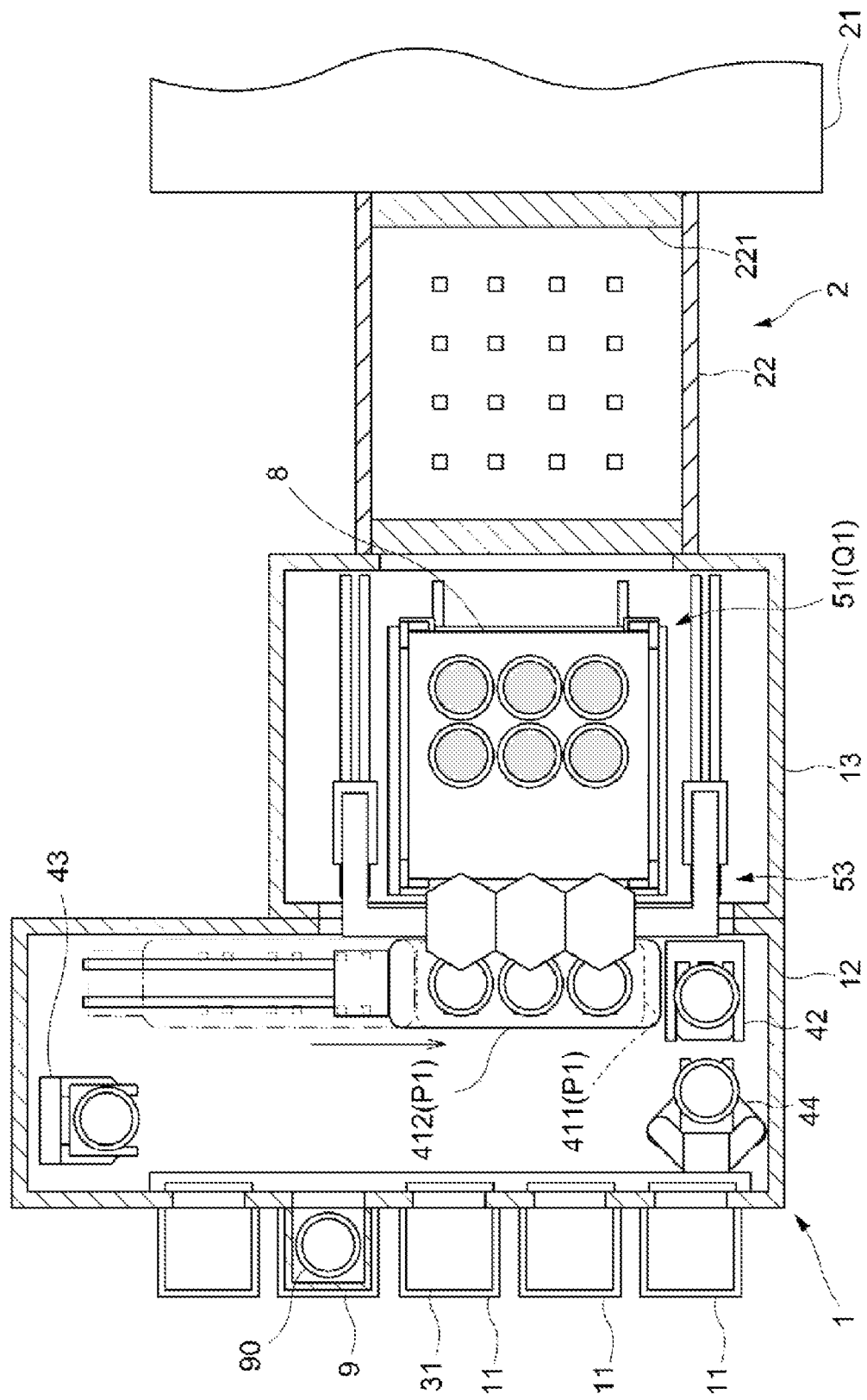
FIG. 9 is a diagram for explaining the third aspect in the series of operations performed in the transport system.
Figure 10:
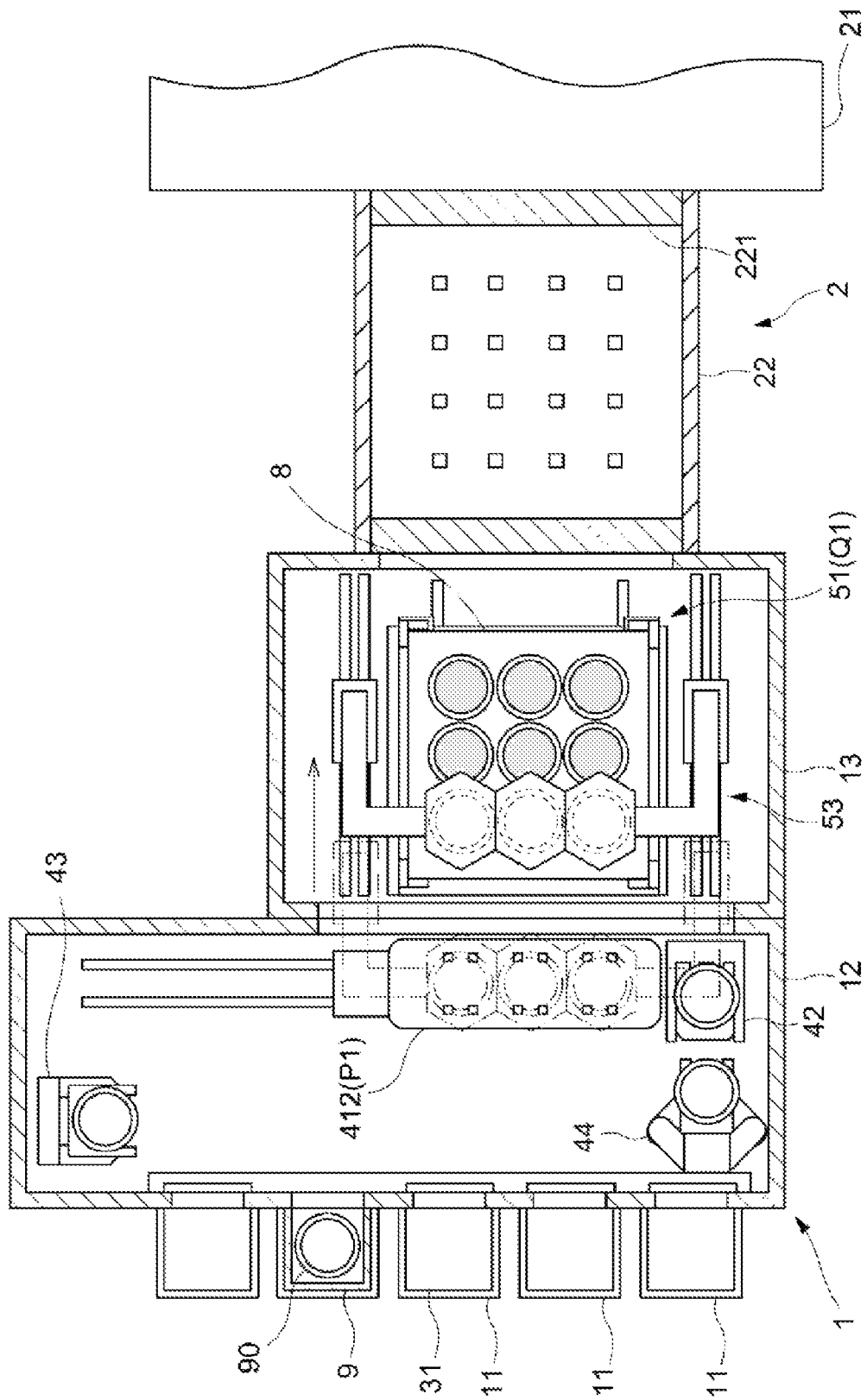
FIG. 10 is a diagram for explaining the third aspect in the series of operations performed in the transport system.

In parallel with the above operation, the second transport device 53 collectively transports the three tape frame wafers 90 existing in the frontmost row among the nine processed tape frame wafers 90 held in the tray 8 to the fixed stage portion 411 (FIG. 8). Thereafter, the stage driving mechanism 413 moves the movable stage portion 412 from the retracted position P2 to the delivery position P1 (FIG. 9). After the movable stage portion 412 is arranged at the delivery position P1, the second transport device 53 collectively transports the three unprocessed tape frame wafers 90 mounted on the movable stage portion 412 to the vacant position (frontmost row) on the tray 8 (FIG. 10).

Figure 11:
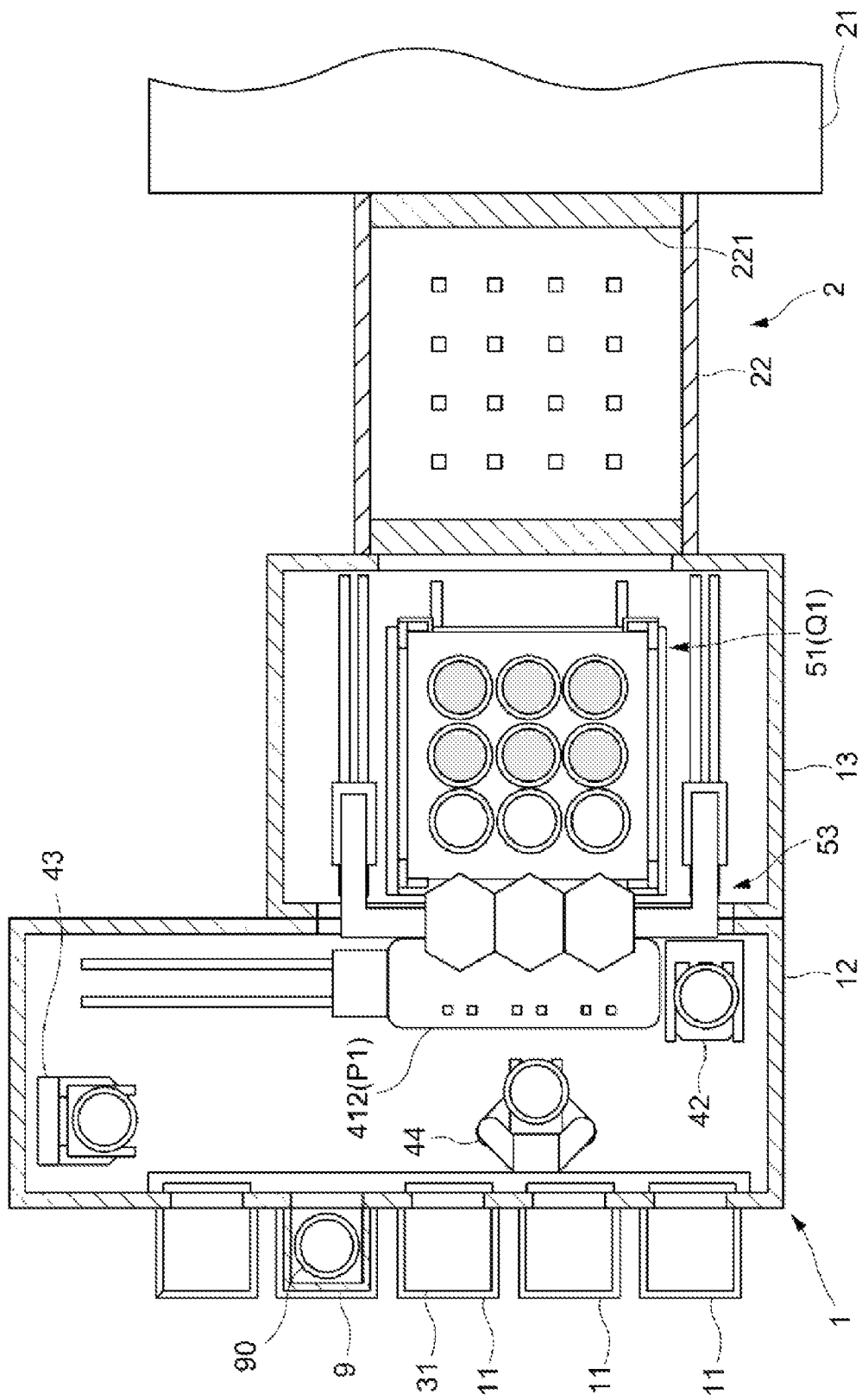
FIG. 11 is a diagram for explaining the third aspect in the series of operations performed in the transport system.

In this way, the state shown in FIG. 11 is obtained. That is, the tray 8 holds three unprocessed tape frame wafers 90 and six processed tape frame wafers 90. Further, the movable stage portion 412 is vacant, and the fixed stage portion 411 is filled with three processed tape frame wafers 90. In addition, six unprocessed tape frame wafers 90 are stored in the stocker 42.

Fourth Aspect

Figure 13:
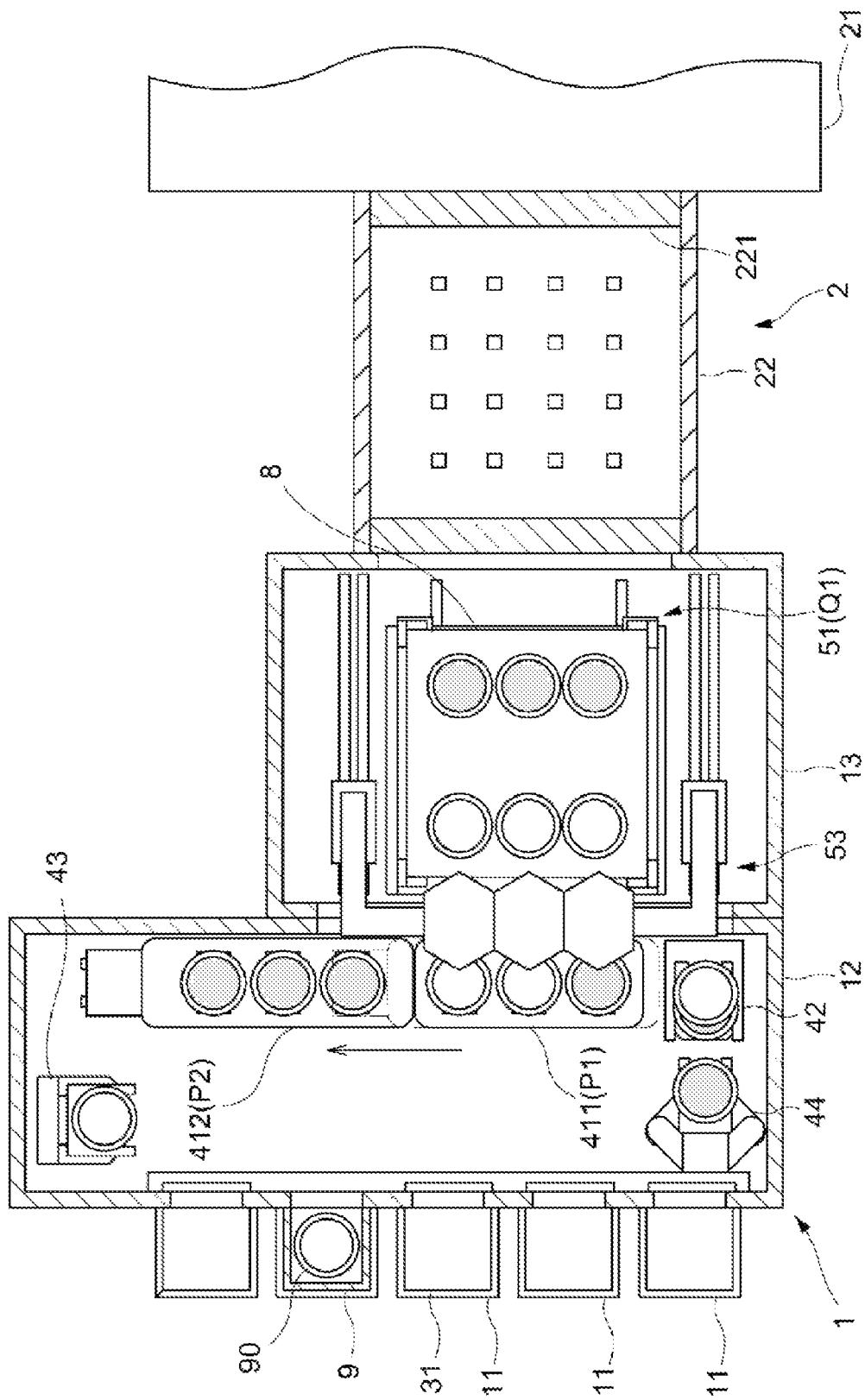
FIG. 13 is a diagram for explaining the fourth aspect in the series of operations performed in the transport system.
Figure 14:
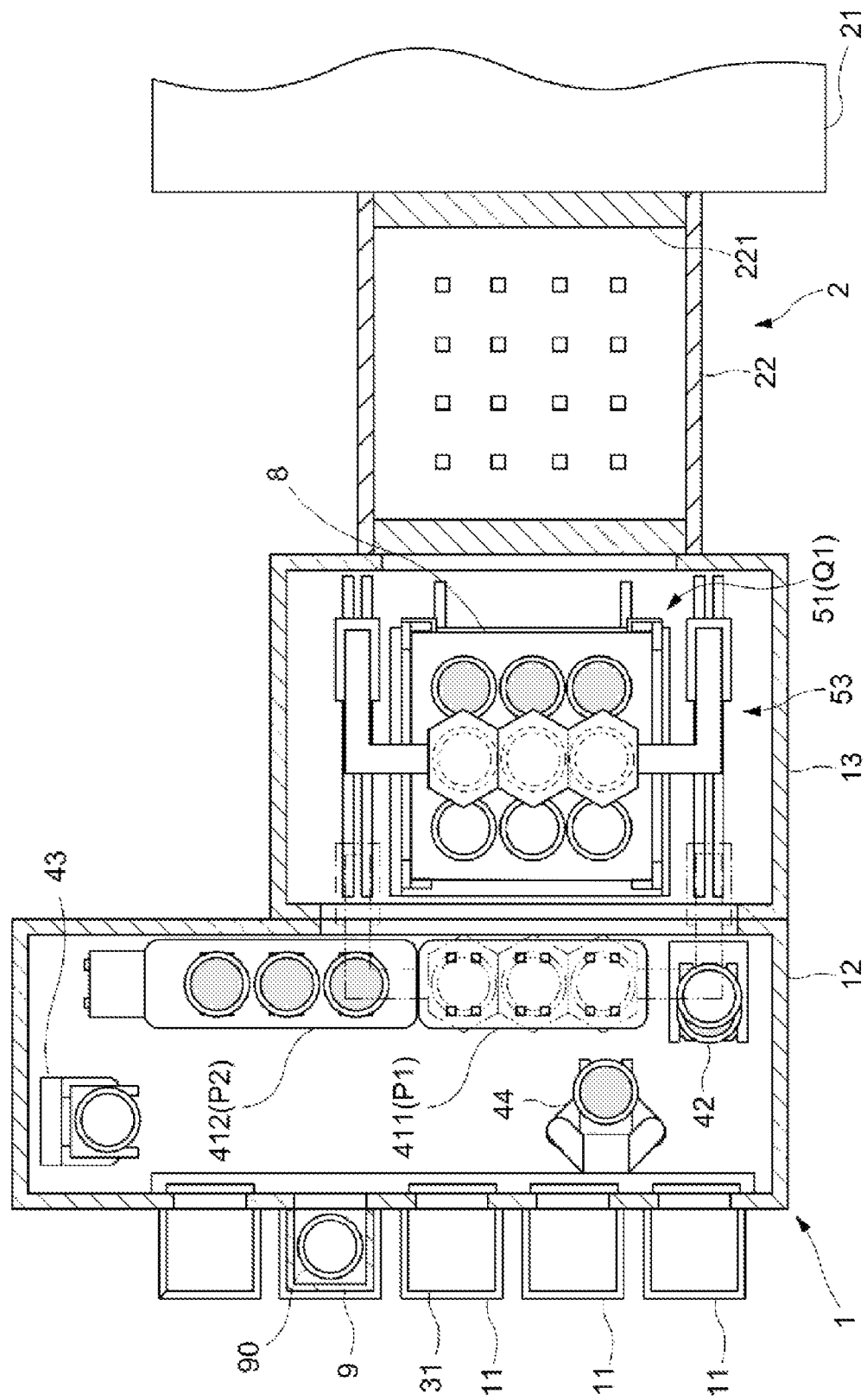
FIG. 14 is a diagram for explaining the fourth aspect in the series of operations performed in the transport system.

After three processed tape frame wafers 90 are mounted on the fixed stage portion 411, the first transport device 44 sequentially transports the processed tape frame wafers 90 mounted on the fixed stage portion 411 to the stocker 42 and sequentially transports the unprocessed tape frame wafers 90 stored in the stocker 42 to the vacant positions on the fixed stage portion 411. Such an operation is repeated to mount three unprocessed tape frame wafers 90 on the fixed stage portion 411 (FIGS. 12 to 14).

Figure 12:
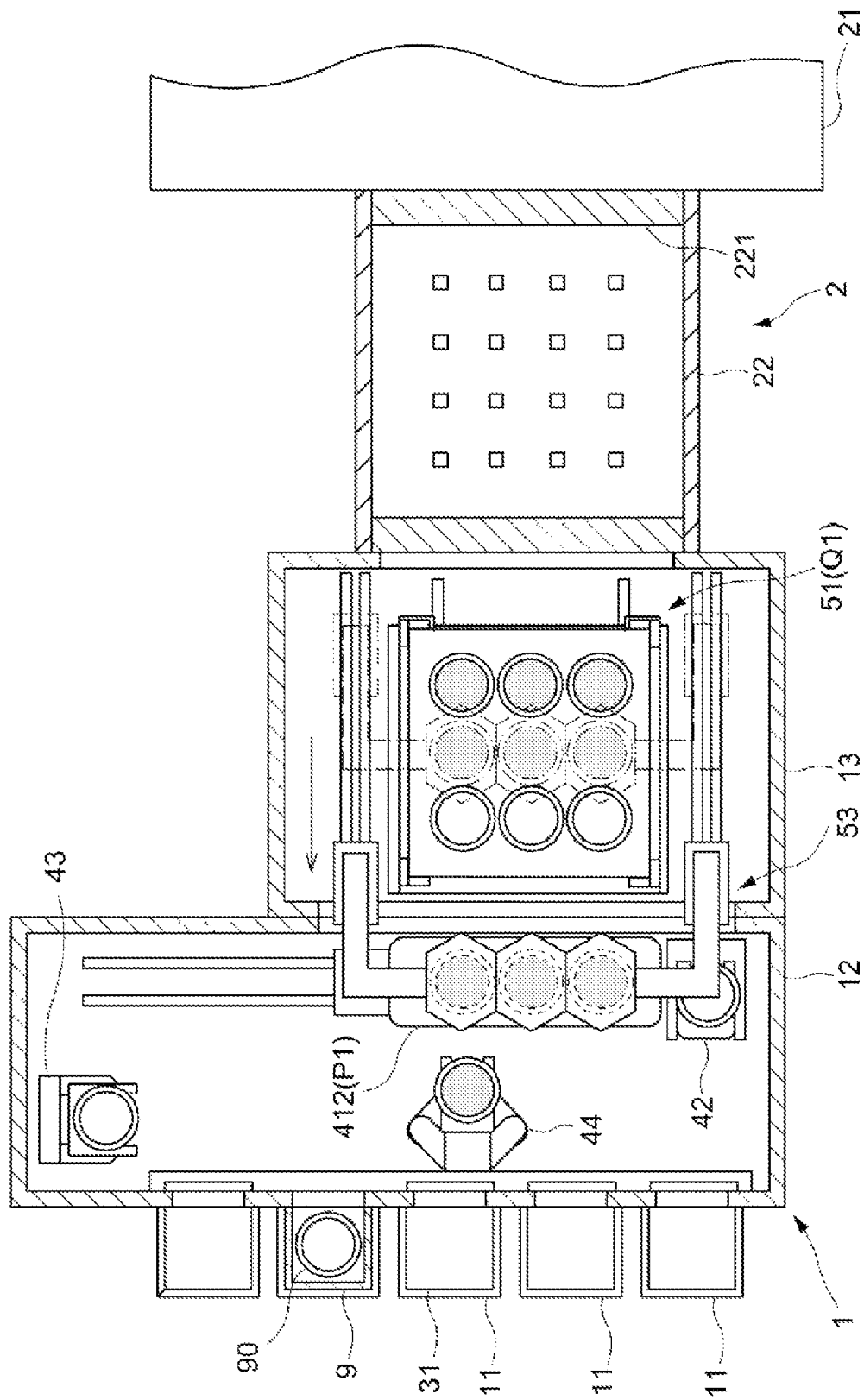
FIG. 12 is a diagram for explaining a fourth aspect in the series of operations performed in the transport system.

In parallel with the above operation, the second transport device 53 collectively transports three tape frame wafers 90 existing in the front row among the six processed tape frame wafers 90 held on the tray 8 to the movable stage portion 412 (FIG. 12). Thereafter, the stage driving mechanism 413 moves the movable stage portion 412 from the delivery position P1 to the retracted position P2 (FIG. 13). After the movable stage portion 412 is arranged at the retracted position P2, the second transport device 53 collectively transports the three unprocessed tape frame wafers 90 mounted on the fixed stage portion 411 to the vacant positions (middle row) on the tray 8 (FIG. 14).

Figure 15:
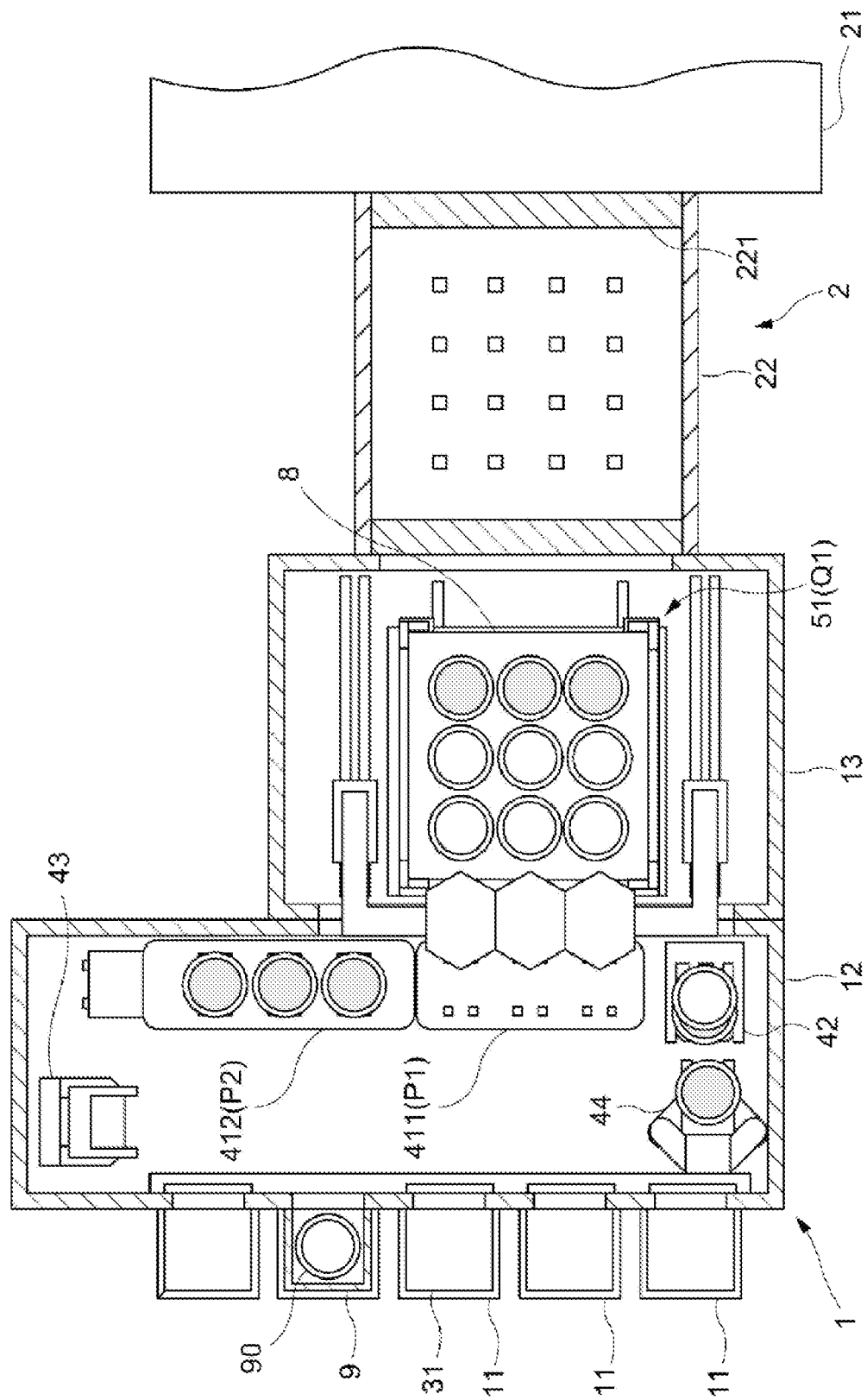
FIG. 15 is a diagram for explaining the fourth aspect in the series of operations performed in the transport system.

In this way, the state shown in FIG. 15 is obtained. That is, the tray 8 holds six unprocessed tape frame wafers 90 and three processed tape frame wafers 90. Further, the movable stage portion 412 is filled with three processed tape frame wafers 90, and the fixed stage portion 411 is vacant. In addition, the stocker 42 stores three processed tape frame wafers 90 and three unprocessed tape frame wafers 90.

Fifth Aspect

Figure 16:
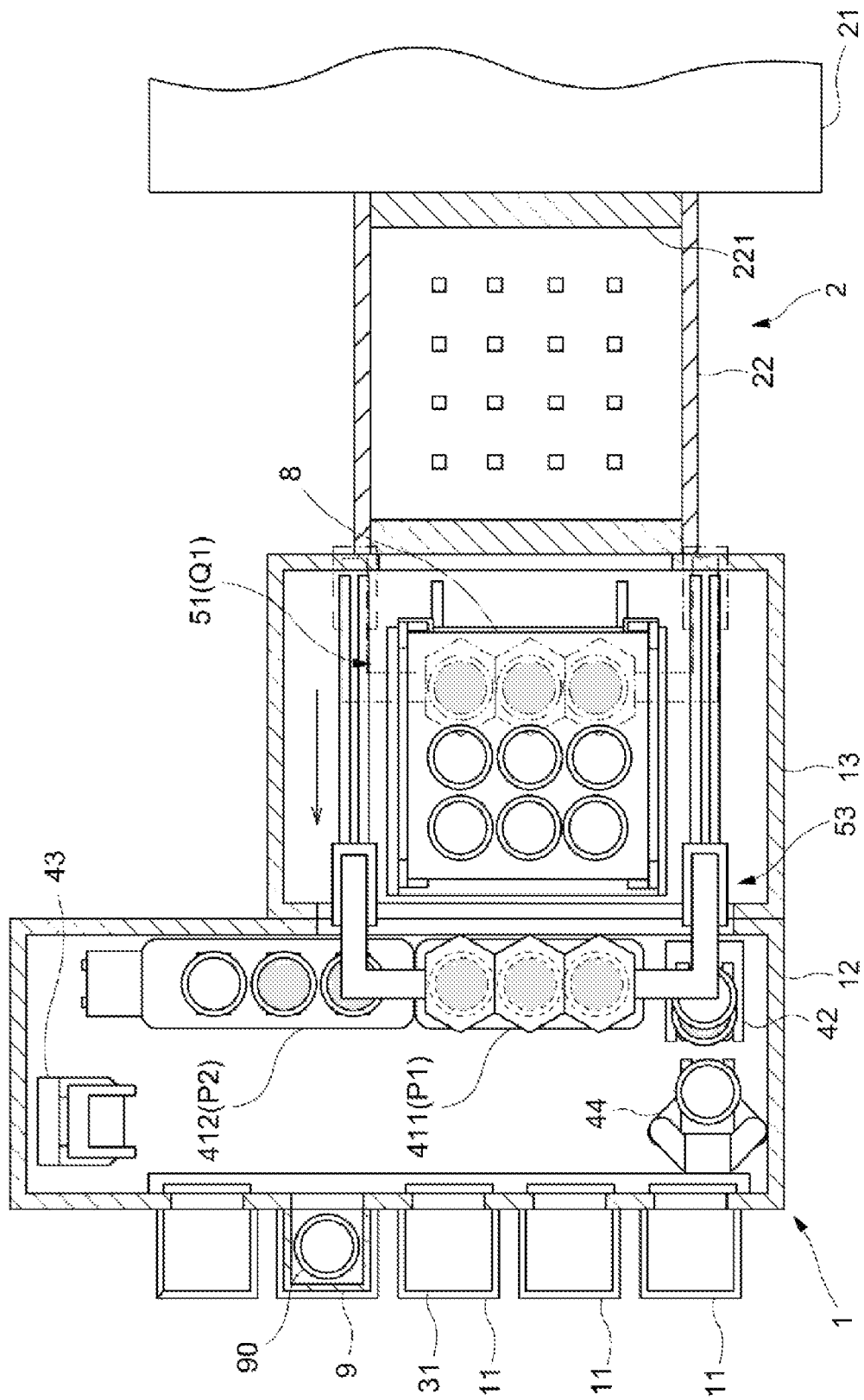
FIG. 16 is a diagram for explaining a fifth aspect in the series of operations performed in the transport system.
Figure 17:
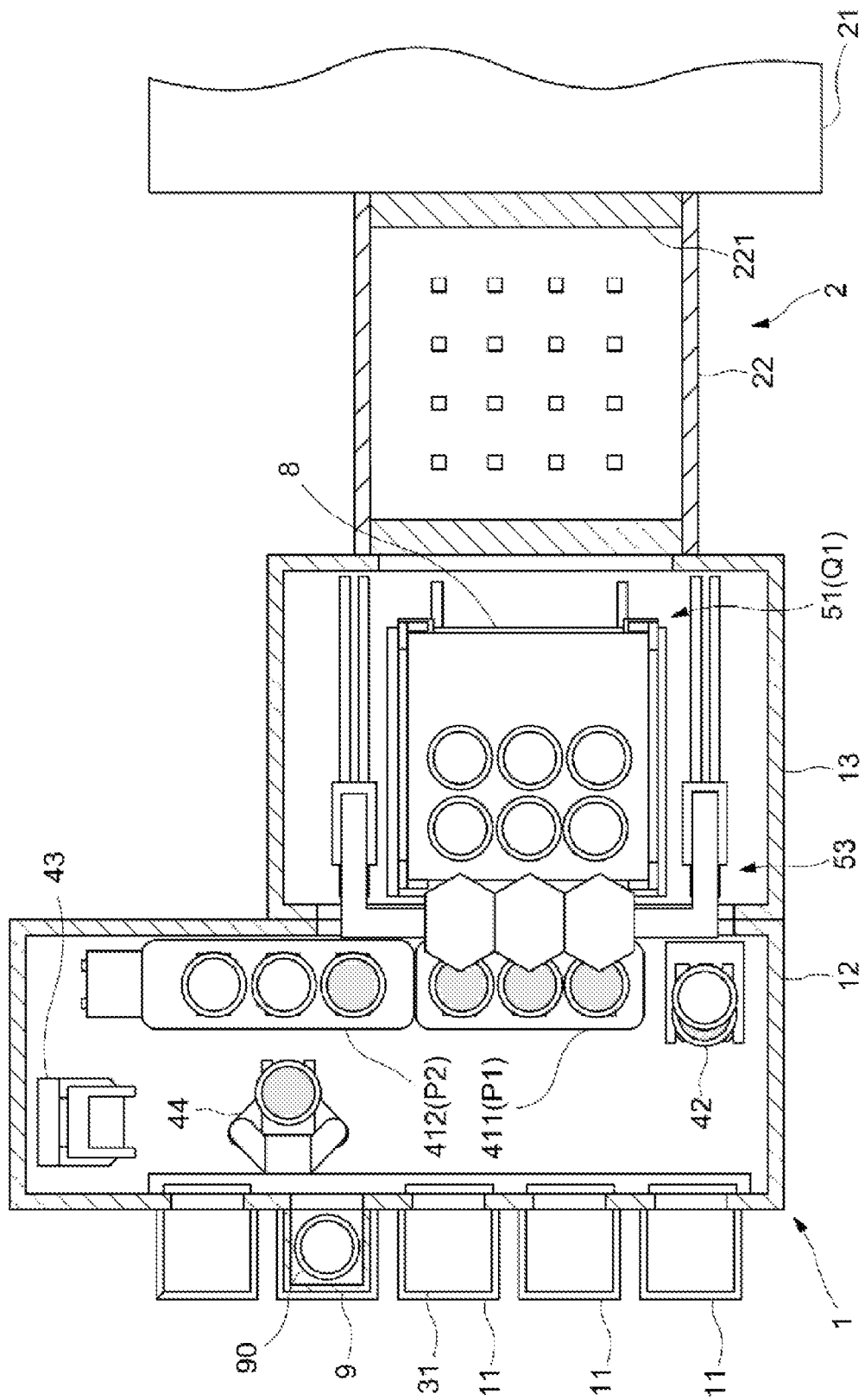
FIG. 17 is a diagram for explaining the fifth aspect in the series of operations performed in the transport system.
Figure 18:
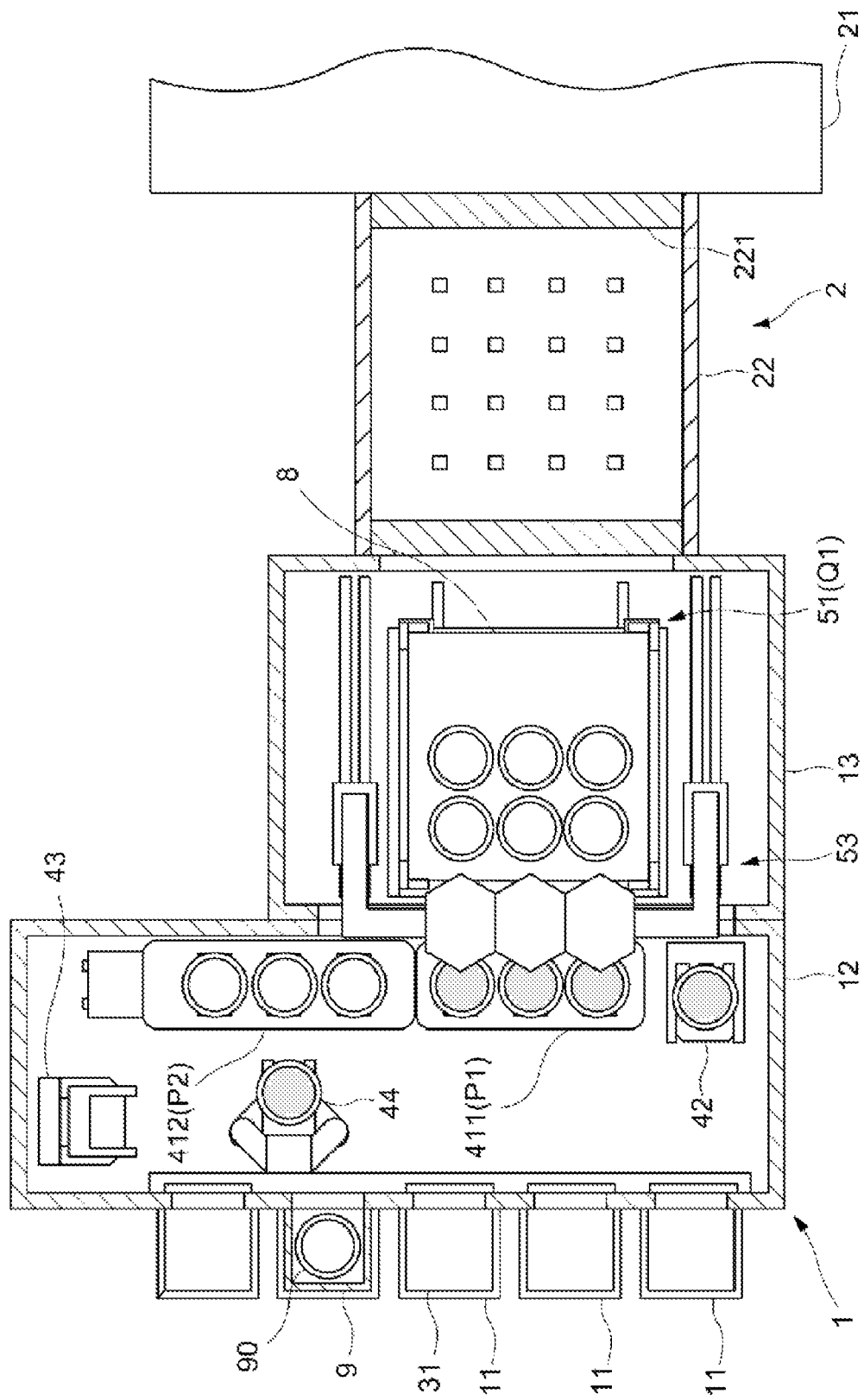
FIG. 18 is a diagram for explaining the fifth aspect in the series of operations performed in the transport system.
Figure 19:
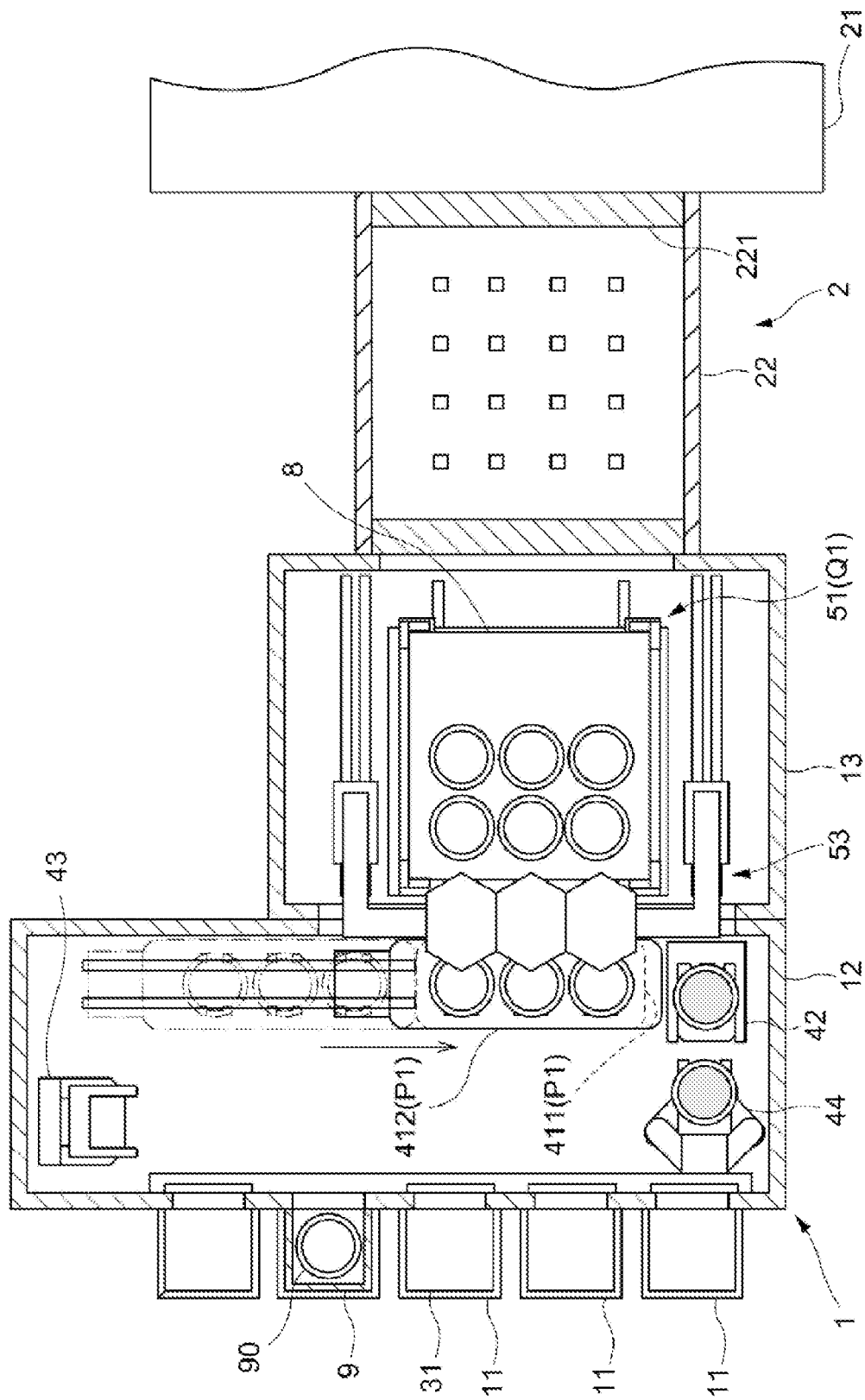
FIG. 19 is a diagram for explaining the fifth aspect in the series of operations performed in the transport system.
Figure 20:
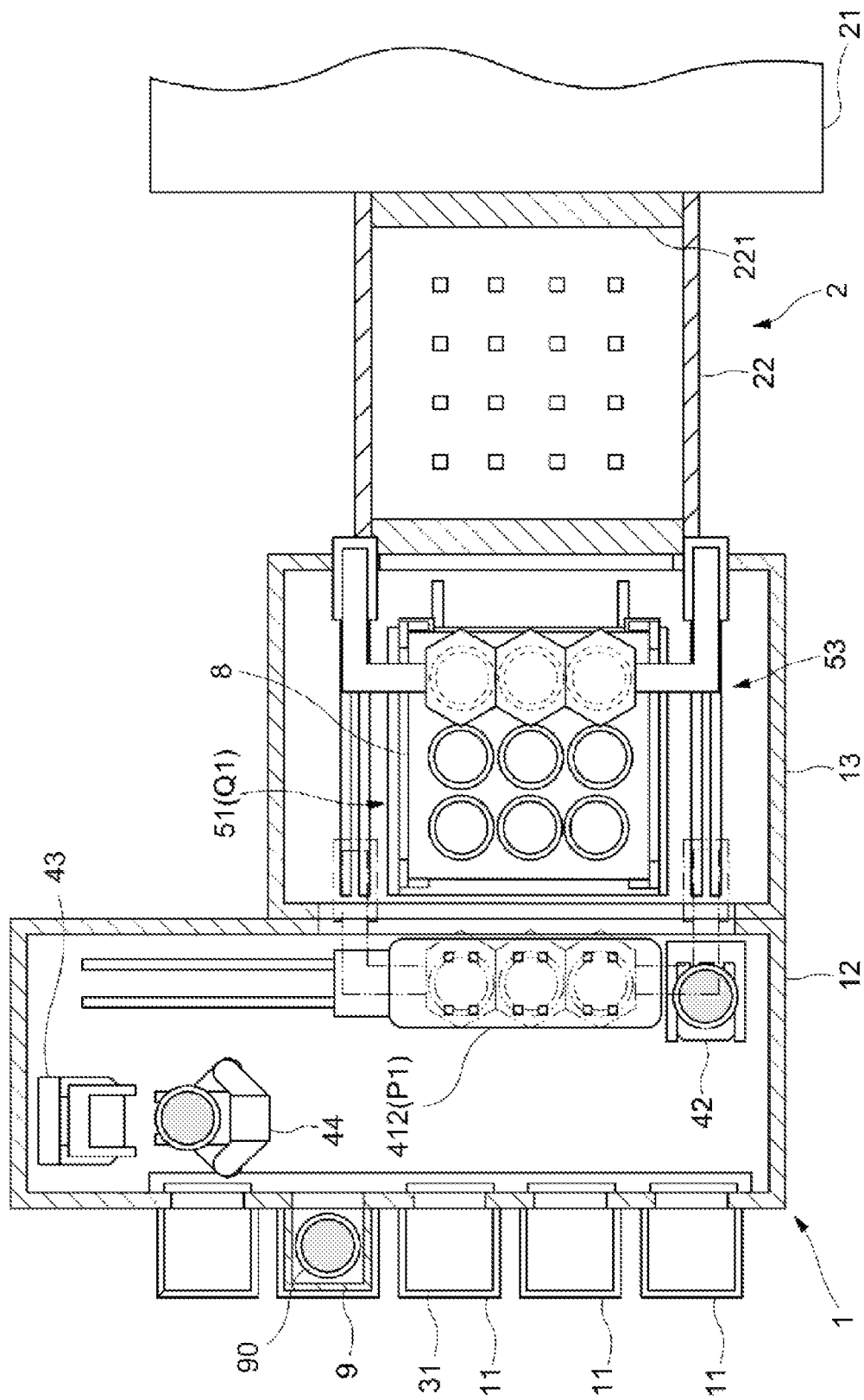
FIG. 20 is a diagram for explaining the fifth aspect in the series of operations performed in the transport system.

After the processed tape frame wafers 90 are mounted on the movable stage portion 412, the first transport device 44 sequentially transports the processed tape frame wafers 90 mounted on the movable stage portion 412 to the stocker 42 and sequentially transports the unprocessed tape frame wafers 90 stored in the stocker 42 to the vacant positions on the movable stage portion 412. Such an operation is repeated to mount three unprocessed tape frame wafers 90 on the movable stage portion 412 (FIGS. 16 to 18). After three unprocessed tape frame wafers 90 are mounted on the movable stage portion 412, the first transport device 44 subsequently takes out the processed tape frame wafers 90 stored in the stocker 42, delivers the processed tape frame wafers 90 to the inverting device 43, receives the inverted tape frame wafers 90, and transports the inverted tape frame wafers 90 to the storage container 9 mounted on the mounting part 31 (FIGS. 19 to 21).

In parallel with the above operation, the second transport device 53 collectively transports the remaining three processed tape frame wafers 90 held on the tray 8 to the fixed stage portion 411 (FIG. 16). Thereafter, when three unprocessed tape frame wafers 90 are mounted on the movable stage portion 412 (FIG. 18), the stage driving mechanism 413 moves the movable stage portion 412 from the retracted position P2 to the delivery position P1 (FIG. 19). After the movable stage portion 412 is arranged at the delivery position P1, the second transport device 53 collectively transports the three unprocessed tape frame wafers 90 mounted on the movable stage portion 412 to the vacant positions (rear row) on the tray 8 (FIG. 20).

Figure 21:
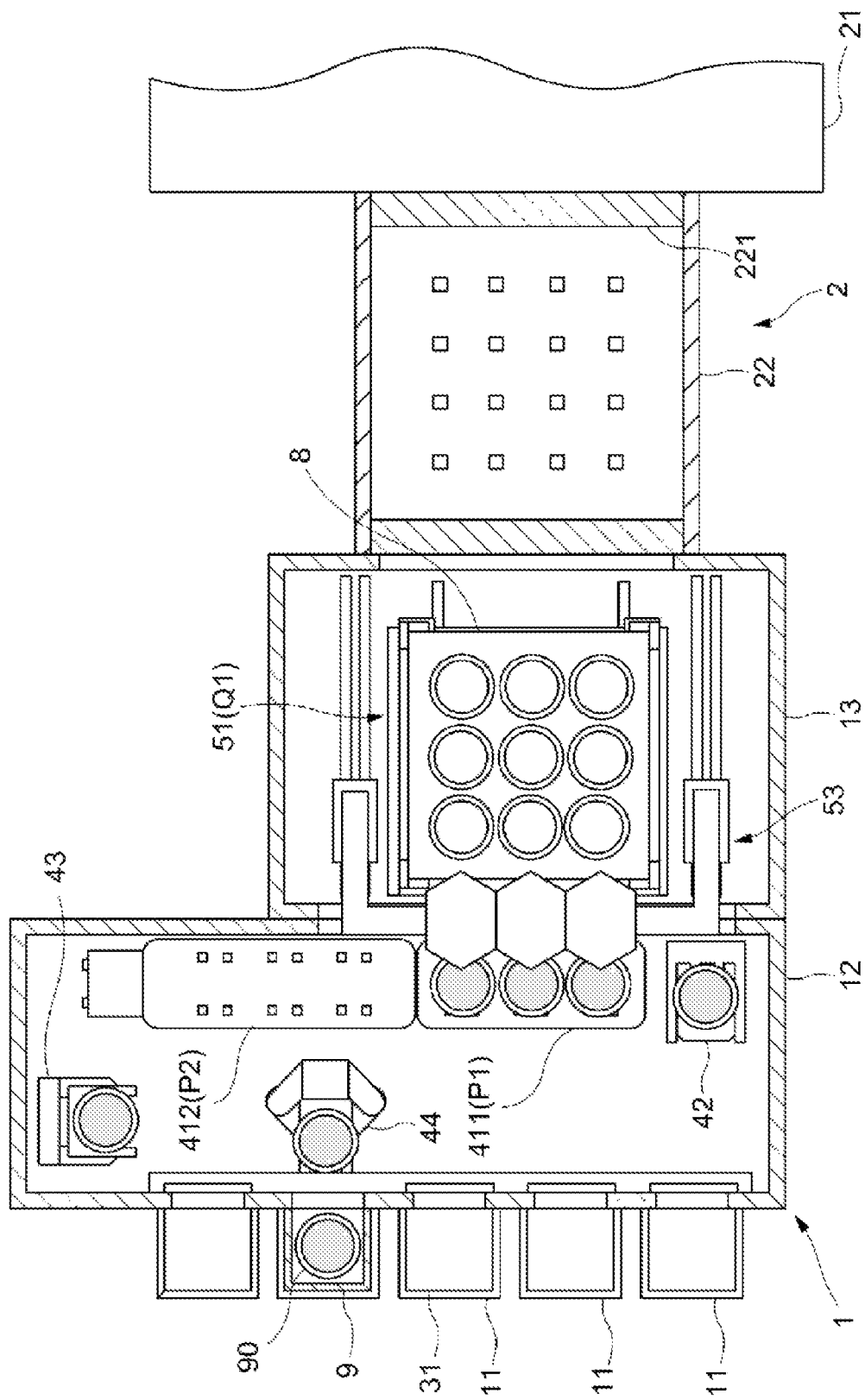
FIG. 21 is a diagram for explaining the fifth aspect in the series of operations performed in the transport system.

In this way, the state shown in FIG. 21 is obtained. That is, nine unprocessed tape frame wafers 90 are held on the tray 8. Further, the movable stage portion 412 is vacant, and the fixed stage portion 411 is filled with three processed tape frame wafers 90. In addition, only 0 to 6 processed tape frame wafers 90 remain in the stocker 42.

Sixth Aspect

Figure 22:
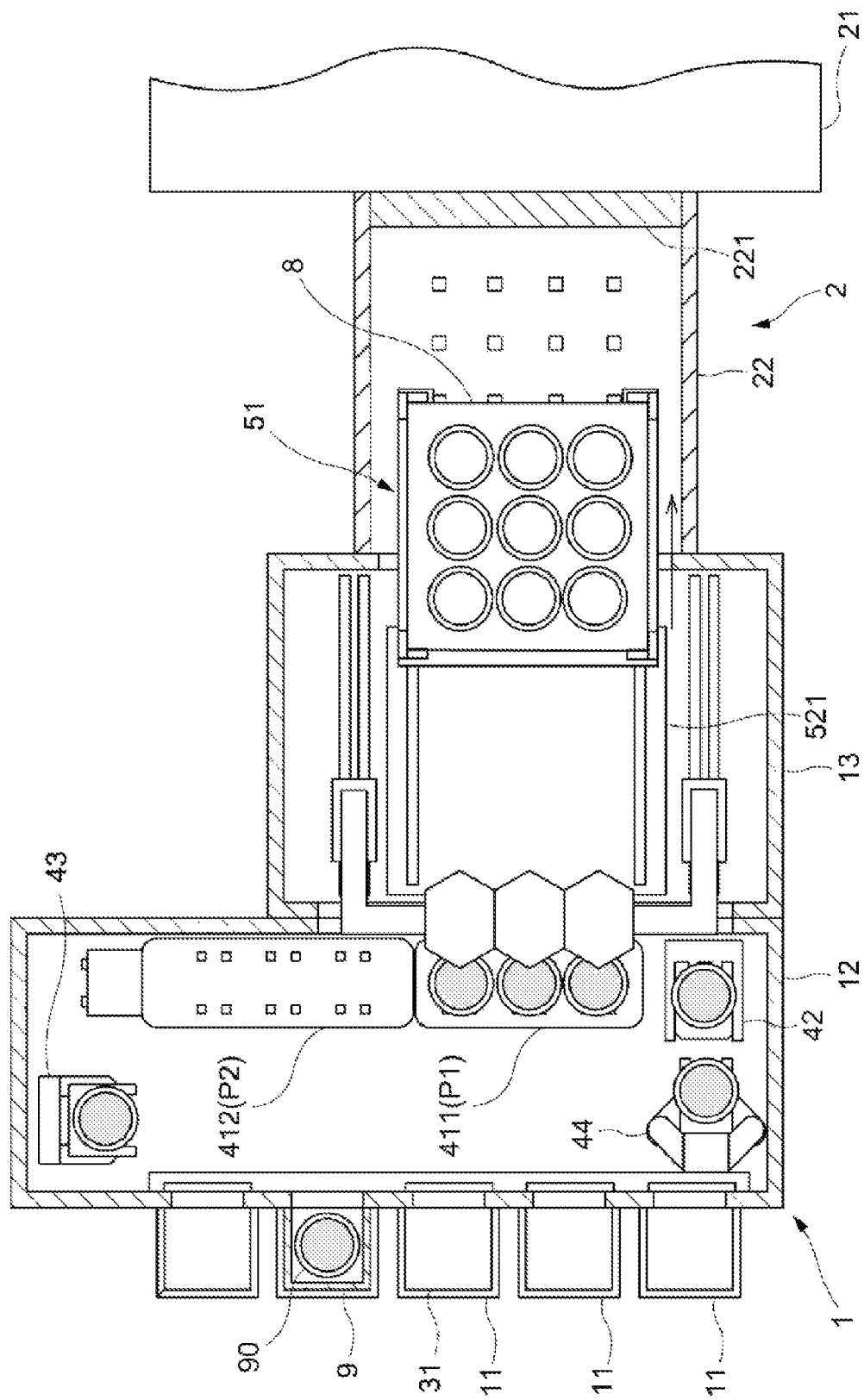
FIG. 22 is a diagram for explaining a sixth aspect in the series of operations performed in the transport system.
Figure 24:
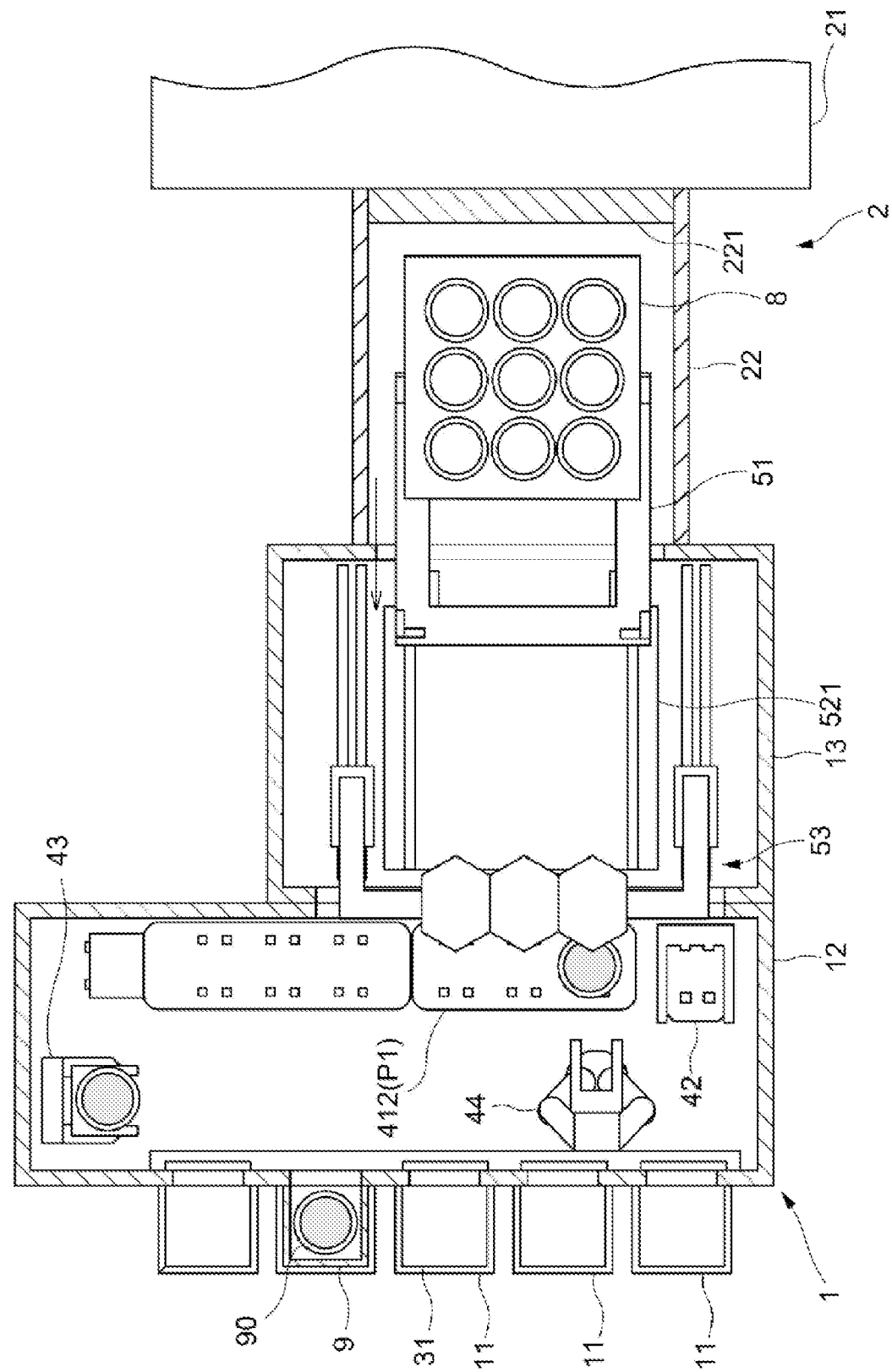
FIG. 24 is a diagram for explaining the sixth aspect in the series of operations performed in the transport system.
Figure 25:
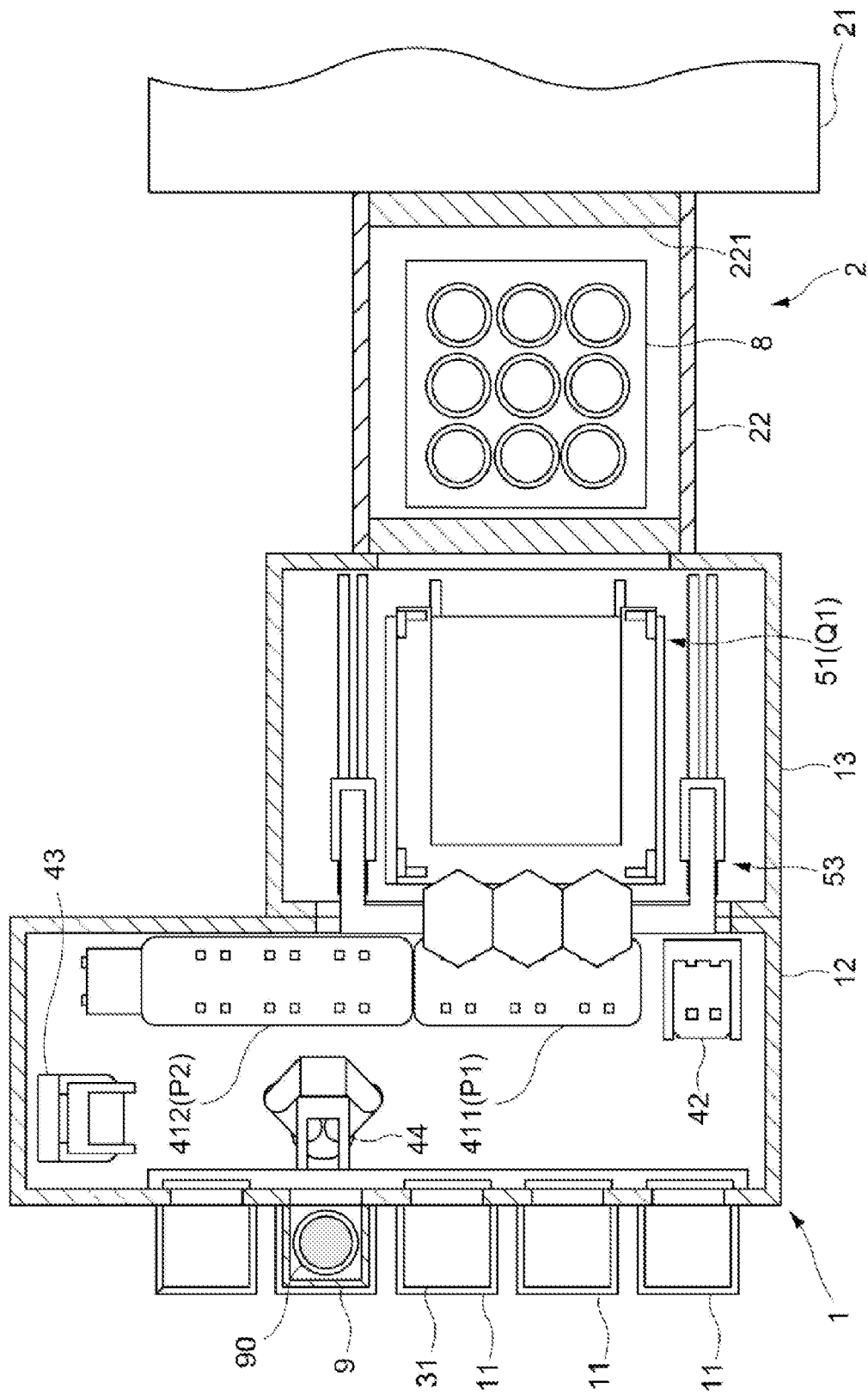
FIG. 25 is a diagram for explaining the sixth aspect in the series of operations performed in the transport system.

The first transport device 44 repeats the operation of transporting the processed tape frame wafers 90 from the stocker 42 to the storage container 9 until the processed tape frame wafer 90 is exhausted. That is, the first transport device 44 repeats the operation of takings out the processed tape frame wafers 90 stored in the stocker 42, delivering the processed tape frame wafers 90 to the inverting device 43, receiving the inverted tape frame wafers 90, and transporting the inverted tape frame wafers 90 to the storage container 9 mounted on the mounting part 31 (FIG. 22). Then, when the processed tape frame wafers 90 disappears from the stocker 42, the first transport device 44 subsequently holds the processed tape frame wafers 90 mounted on the fixed stage portion 411, delivers the processed tape frame wafers 90 to the inverting device 43, receives the inverted tape frame wafers 90 from the inverting device 43, and transports the inverted tape frame wafers 90 to the storage container 9 mounted on the mounting part 31. By repeating such an operation, all the three processed tape frame wafers 90 mounted on the fixed stage portion 411 are stored in the storage container 9 (FIGS. 23 to 25).

Figure 23:
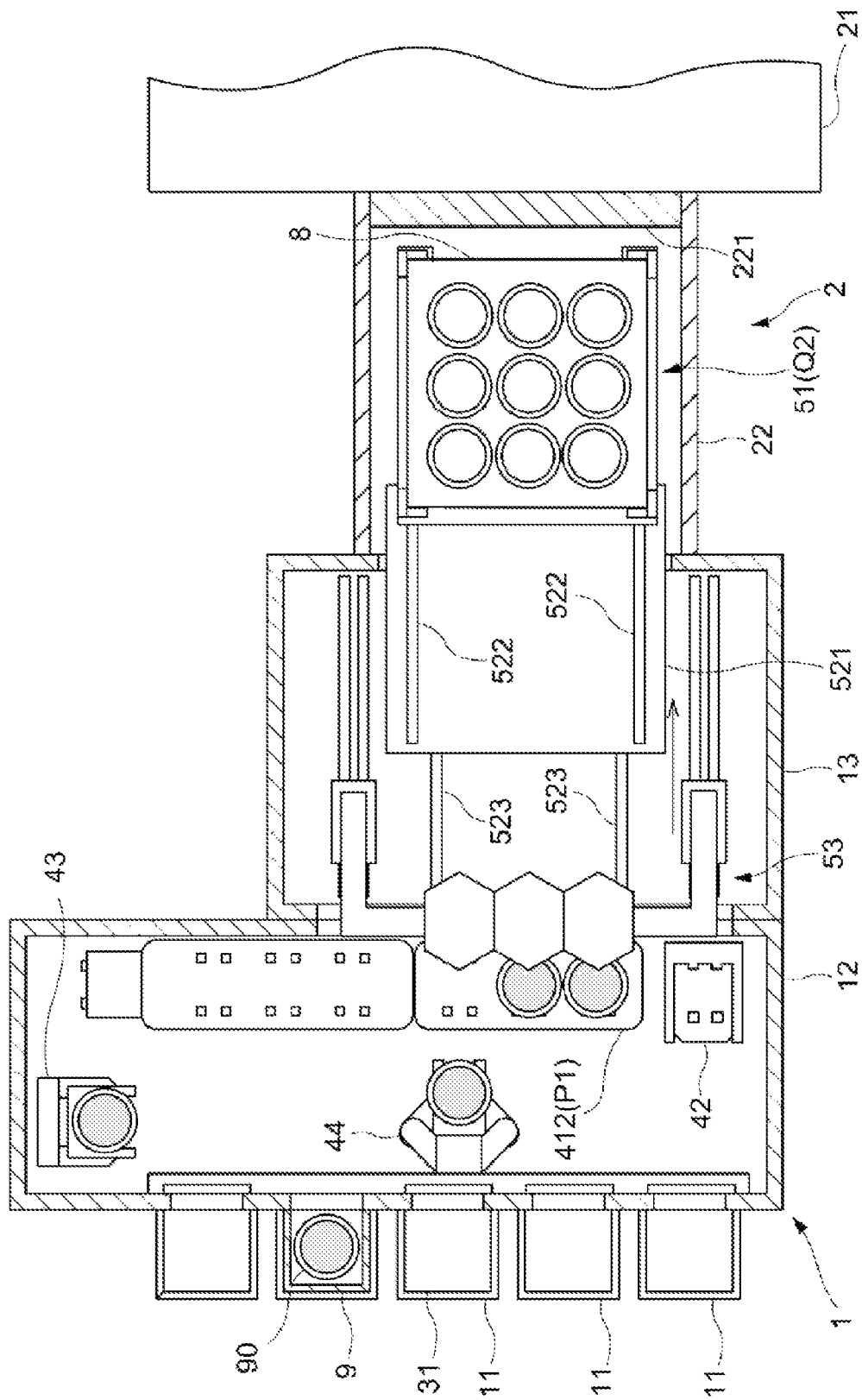
FIG. 23 is a diagram for explaining the sixth aspect in the series of operations performed in the transport system.

In parallel with the above operation, the tray support part driving mechanism 52 moves the tray support part 51 from the delivery position Q1 to the pin group position Q2 (FIGS. 22 and 23). In the state in which the tray support part 51 is arranged at the pin group position Q2, the tray support pin group 222 is brought into a protruding state so that the tray 8 can be transported from the tray support part 51 onto the tray support pin group 222. Thereafter, the tray support part driving mechanism 52 moves the tray support part 51 from the pin group position Q2 to the delivery position Q1 (FIGS. 24 and 25). As a result, the tray 8 is carried into the load lock part 22 from the second housing 131.

Figure 26:
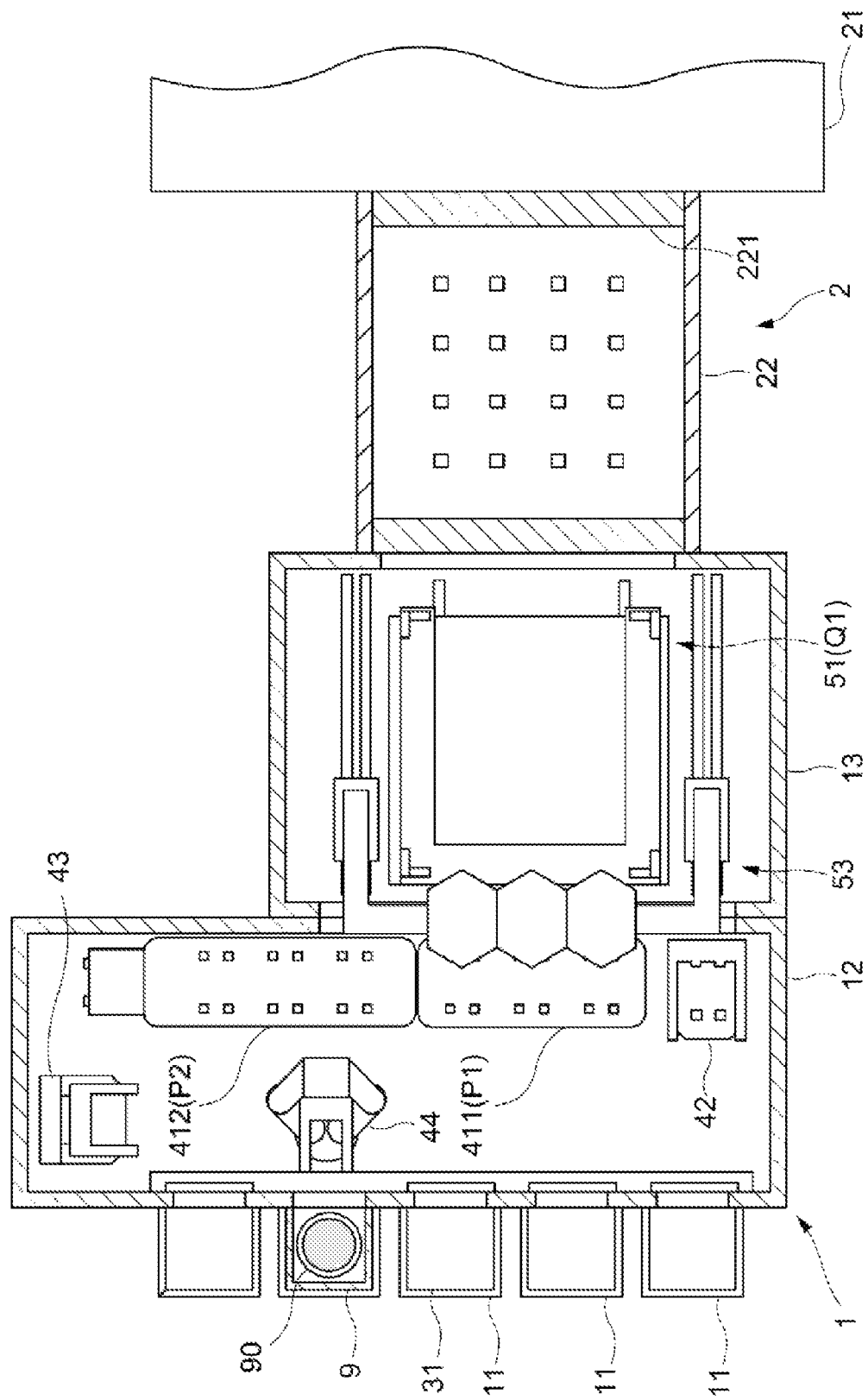
FIG. 26 is a diagram for explaining the sixth aspect in the series of operations performed in the transport system.

Thereafter, under the control of the processing apparatus 2, the tray 8 is carried from the load lock part 22 into the processing part 21, and a predetermined process is collectively performed on the nine tape frame wafers 90 held on the tray 8 (FIG. 26). In the state shown in FIG. 26, the nine unprocessed tape frame wafers 90 stored in the storage container 9 in the above-described "first aspect" are held on the tray 8 and processed by the processing apparatus 2, and the nine processed tape frame wafers 90 held on the tray 8 in the "first aspect" are stored in the storage container 9.

In the transport system 1, by repeating the series of operations described above, the unprocessed tape frame wafers 90 stored in the storage container 9 are sequentially transported to the tray 8, and the processed tape frame wafers 90 held on the tray 8 are sequentially stored in the storage container 9.

However, the series of transport operations described above is merely an example. The series of transport operations performed by the transport system 1 may be arbitrarily set according to the processing recipe, the number of tape frame wafers 90 held on the tray 8, the number of tape frame wafers 90 stored in the storage container 9, and the like.

3. Effect

The transport system 1 according to the above-described embodiment transports a plurality of tape frame wafers 90 as objects between a storage container 9 for storing the tape frame wafers 90 and a processing apparatus 2 for collectively processing the tape frame wafers 90 held on a tray 8. The transport system 1 includes a mounting part 31 on which the storage container 9 is mounted, a stage 41 on which the tape frame wafers 90 are mounted, a tray support part 51 configured to support the tray 8, a first transport device 44 configured to transport the tape frame wafers 90 between the storage container 9 mounted on the mounting part 31 and the stage 41, and a second transport device 53 configured to transport the tape frame wafers 90 between the stage 41 and the tray 8 supported by the tray support part 51.

According to this configuration, two transport devices (the first transport device 44 and the second transport device 53) transport the tape frame wafers 90 between the storage container 9 and the tray 8 while cooperating with each other via the stage 41. Therefore, for example, while one transport device is performing an operation of transporting the unprocessed tape frame wafers 90 toward the tray 8 (feed transport operation), the other transport device can perform an operation of transporting the processed tape frame wafers 90 toward the storage container 9 (return transport operation). That is, it is possible to simultaneously perform the feed transport operation and the return transport operation, and it is possible to efficiently transport the tape frame wafers 90 between the storage container 9 for storing the tape frame wafers 90 and the processing apparatus 2 for collectively processing the tape frame wafers 90.

Further, in the transport system 1 according to the above embodiment, the second transport device 53 is configured to transport three tape frame wafers 90 at a time, and the tray 8 is configured to hold 3×3 tape frame wafers 90.

According to this configuration, the second transport device 53 transports a plurality of tape frame wafers 90 at a time. Therefore, the second transport device 53 can efficiently transport the tape frame wafers 90 between the stage 41 and the tray 8. In particular, the integral multiple of the number of tape frame wafers 90 that can be transported by the second transport device 53 at one time is the total number of tape frame wafers 90 held on the tray 8. Therefore, it is possible to especially enhance the transport efficiency of the second transport device 53.

Further, in the transport system 1 according to the above embodiment, the stage 41 includes a movable stage portion 412 provided so as to be movable between a delivery position P1 accessible by the second transport device 53 and a retracted position P2 deviated from the delivery position P1, and a fixed stage portion 411 fixedly provided at the delivery position P1 and at a height position vertically shifted from the movable stage portion 412.

According to this configuration, it is possible to sufficiently secure the number of tape frame wafers 90 that can be mounted on the stage 41. Therefore, it is possible to enhance the transport efficiency of both the first transport device 44 and the second transport device 53. In particular, in the above embodiment, the maximum number of tape frame wafers 90 that can be mounted on the stage portions 411 and 412 matches the number of tape frame wafers 90 that can be transported by the second transport device 53 at one time. This makes it possible to especially enhance the transport efficiency.

The transport system 1 according to the above embodiment further includes an inverting device 43 configured to invert the tape frame wafers 90. The first transport device 44 is configured to transport the tape frame wafers 90 among the storage container 9 mounted on the mounting part 31, the stage 41, and the inverting device 43.

According to this configuration, the tape frame wafers 90 stored in the storage container 9 can be inverted and then mounted on the tray 8. When the tape frame wafers 90 are inverted and then mounted on the tray 8 in the transport process, it is difficult to shorten the cycle time in the transport process, which may become a bottleneck and may reduce the operating rate of the processing apparatus 2. However, in this configuration, the tape frame wafers 90 are transported between the storage container 9 and the tray 8 while the two transport devices (the first transport device 44 and the second transport device 53) cooperate with each other via the stage 41. This makes it possible to efficiently transport the tape frame wafers 90. Therefore, even when the tape frame wafers 90 are inverted, it is possible to sufficiently shorten the cycle time in the transport process.

The transport system 1 according to the above embodiment further includes a stocker 42 for temporarily storing the tape frame wafers 90. The first transport device 44 is configured to transport the tape frame wafers 90 among the storage container 9 mounted on the mounting part 31, the stage 41, and the stocker 42.

According to this configuration, the first transport device 44 temporarily stores the tape frame wafers 90 stored in the storage container 9 or the tape frame wafers 90 mounted on the stage 41 in the stocker 42 depending on the situation. This makes it possible to efficiently transport the tape frame wafers 90.

In the transport system 1 according to the above embodiment, a tray transport device configured to transport the tray 8 between the transport system 1 and the processing apparatus 2 is configured by a tray support part 51 and a tray support part driving mechanism 52. The tray transport device is configured to receive the tray 8 holding the processed tape frame wafers 90 from the processing apparatus 2 and deliver the tray 8 holding the unprocessed tape frame wafers 90 to the processing apparatus 2.

According to this configuration, the processing apparatus 2 does not need to have a mechanism for delivering the tray 8 to the transport system 1. Therefore, the transport system 1 can be applied to a wide range of processing apparatuses 2.

4. Modification

In the above embodiment, each stage portion 411 or 412 included in the stage 41 can mount up to three tape frame wafers 90, but the maximum number of tape frame wafers 90 that can be mounted on each stage portion 411 or 412 does not have to be three. As described above, in order to improve the transport efficiency, it is preferable that the maximum number of tape frame wafers 90 that can be mounted on the stage portion 411 or 412 matches the number of tape frame wafers 90 that can be transported by the second transport device 53 at one time.

In the above embodiment, the stage 41 includes the movable stage portion 412 and the fixed stage portion 411. However, the movable stage portion 412 does not necessarily have to be provided. On the contrary, a plurality of movable stage portions 412 may be provided. In this case, all the fixed stage portion 411 and the plurality of movable stage portions 412 are provided at height positions shifted vertically from each other so that all the stage portions 411 and 412 can be arranged at the delivery position P1 without interfering with each other.

In the above embodiment, the second transport device 53 is configured to transport three tape frame wafers 90 at one time. However, the second transport device 53 may be configured to transport the tape frame wafers 90 one by one or may be configured to transport two or four or more tape frame wafers 90 at one time. As described above, in order to improve the transport efficiency of the second transport device 53, it is preferable that the integral multiple of the number of tape frame wafers 90 that can be transported by the second transport device 53 at one time is equal to the total number of tape frame wafers 90 held on the tray 8.

The transport system 1 according to the above embodiment is provided with the inverting device 43. However, the inverting device 43 is not an essential element and may be omitted. For example, if the processing apparatus 2 is configured to process the tape frame wafers 90 in the posture of being stored in the storage container 9, the inverting device 43 may be omitted.

The transport system 1 according to the above embodiment is provided with the stocker 42. However, the stocker 42 is not an essential element and may be omitted. For example, if the stage 41 can mount a sufficiently large number of tape frame wafers 90, the stocker 42 may be omitted.

The transport system 1 according to the above embodiment is provided with five load ports 11. However, the number of load ports 11 is not limited to five.

In the transport system 1 according to the above embodiment, the first transport device 44 includes two sets of an arm 443 and a hand 444 connected to the arm 443. However, the first transport device 44 includes one set or three or more sets of an arm 443 and a hand 444 connected to the arm 443.

In the transport system 1 according to the above embodiment, the tray support part driving mechanism 52 is not an essential element and may be omitted. For example, if the processing apparatus is provided with a mechanism for delivering the tray to the transport system, the tray support part driving mechanism 52 may be omitted.

In the above embodiment, the object transported by the transport system 1 is the wafer 91 held by the annular frame 93 via the adhesive tape 92. However, the frame 93 is not limited to an annular shape but may be a polygonal frame shape or the like. Further, the object does not have to be the tape frame wafer 90 but may be a wafer which is not held by the frame. Alternatively, the object may be other than a wafer.

Other configurations may be variously modified without departing from the scope of the present disclosure.

Industrial Use of the Present Invention

The present disclosure can be used as a transport system that transports an object (typically a wafer, or a wafer held in a frame via an adhesive tape, a film, or the like) between a storage container for containing the object and a processing apparatus for processing the object.

EXPLANATION OF REFERENCE NUMERALS

1: transport system, 11: load port, 31: mounting part, 12: first transport part, 41: stage, 411: fixed stage portion, 412: movable stage portion, 413: stage driving mechanism, 42: stocker, 43: inverting device, 44: first transport device, 13: second transport part, 51: tray support part, 52: tray support part driving mechanism, 53: second transport device, 14: controller, 2: processing apparatus, 21: processing part, 22: load lock part, 8: tray, 9: storage container, 90: object (tape frame wafer)

What is claimed is:

1. A transport system for transporting a plurality of objects between a storage container configured to store the plurality of objects and a processing apparatus configured to collectively process the plurality of objects held on a tray, comprising:
a mounting part on which the storage container is mounted;
a stage disposed in a first housing on which the plurality of objects are mounted;
a tray support part disposed in a second housing separate from the first housing configured to support the tray;
a first transport device configured to transport the plurality of objects between the storage container mounted on the mounting part and the stage; and
a second transport device configured to transport the plurality of objects in a horizontal first direction between the stage and the tray supported by the tray support part; wherein the stage includes:
a movable stage portion provided to be movable on horizontal pair of rails in a second direction between a delivery position accessible by the second transport device and a retracted position deviated from the delivery position; and
a fixed stage portion fixedly provided at the delivery position and at a height position vertically shifted from and disposed below the movable stage portion; wherein the first direction is perpendicular to the second direction.

2. The transport system of claim 1, wherein the second transport device is configured to transport n objects where n is an integer of 2 or more at a time, and wherein the tray is configured to hold n×m objects where m is an integer of 1 or more.

3. The transport system of claim 2, further comprising:
an inverting device configured to invert the plurality of objects,
wherein the first transport device is configured to transport the plurality of objects among the storage container mounted on the mounting part, the stage, and the inverting device.

4. The transport system of claim 3, further comprising:
a stocker configured to temporarily store the plurality of objects,
wherein the first transport device is configured to transport the plurality of objects among the storage container mounted on the mounting part, the stage, and the stocker.

5. The transport system of claim 4, further wherein the tray support part and a tray support part driving mechanism are configured to receive the tray holding processed objects from the processing apparatus and deliver the tray holding unprocessed objects to the processing apparatus.

6. The transport system of claim 1, further comprising:
an inverting device configured to invert the plurality of objects,
wherein the first transport device is configured to transport the plurality of objects among the storage container mounted on the mounting part, the stage, and the inverting device.

7. The transport system of claim 1, further comprising:
a stocker configured to temporarily store the plurality of objects,
wherein the first transport device is configured to transport the plurality of objects among the storage container mounted on the mounting part, the stage, and the stocker.

8. The transport system of claim 1, wherein the tray support part and a tray support part driving mechanism are configured to receive the tray holding processed objects from the processing apparatus and deliver the tray holding unprocessed objects to the processing apparatus.

* * * * *